(12) United States Patent
Chung et al.

(10) Patent No.: US 12,159,858 B2
(45) Date of Patent: Dec. 3, 2024

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Hyunsoo Chung, Hwaseong-si (KR); Young Lyong Kim, Anyang-si (KR); Inhyo Hwang, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 236 days.

(21) Appl. No.: 17/568,361

(22) Filed: Jan. 4, 2022

(65) Prior Publication Data

US 2023/0023883 A1    Jan. 26, 2023

(30) Foreign Application Priority Data

Jul. 26, 2021 (KR) .................. 10-2021-0098041

(51) Int. Cl.
| | |
|---|---|
| *H01L 25/065* | (2023.01) |
| *H01L 23/00* | (2006.01) |
| *H01L 23/31* | (2006.01) |
| *H01L 23/498* | (2006.01) |
| *H01L 25/00* | (2006.01) |

(52) U.S. Cl.
CPC ...... *H01L 25/0657* (2013.01); *H01L 23/3128* (2013.01); *H01L 23/49811* (2013.01); *H01L 23/49822* (2013.01); *H01L 24/16* (2013.01); *H01L 24/17* (2013.01); *H01L 24/81* (2013.01); *H01L 25/50* (2013.01); *H01L 2224/02331* (2013.01); *H01L 2224/0401* (2013.01); *H01L 2224/16225* (2013.01); *H01L 2224/1703* (2013.01); *H01L 2224/17517* (2013.01); *H01L 2224/81815* (2013.01); *H01L 2225/06562* (2013.01)

(58) Field of Classification Search
None
See application file for complete search history.

(56) References Cited

U.S. PATENT DOCUMENTS

| | | |
|---|---|---|
| 7,906,852 B2 | 3/2011 | Nishimura et al. |
| 8,164,189 B2 | 4/2012 | Takahashi |
| (Continued) | | |

FOREIGN PATENT DOCUMENTS

| | | |
|---|---|---|
| JP | 2006-086150 A | 3/2006 |
| JP | 2006-310649 A | 11/2006 |
| JP | 6066658 B2 | 1/2017 |

*Primary Examiner* — Long Pham
(74) *Attorney, Agent, or Firm* — Fish & Richardson P.C.

(57) ABSTRACT

A semiconductor package includes a first semiconductor chip on a substrate, a buried solder ball on the substrate and spaced apart from the first semiconductor chip, a first molding layer on the substrate and encapsulating and exposing the first semiconductor chip and the buried solder ball, a second semiconductor chip on the first molding layer and vertically overlapping the buried solder ball and a portion of the first semiconductor chip, and a second molding layer on the first molding layer and covering the second semiconductor chip. The second semiconductor chip is supported on the first semiconductor chip through a dummy solder ball between the first and second semiconductor chips. The second semiconductor chip is connected to the buried solder ball through a signal solder ball between the buried solder ball and the second semiconductor chip.

16 Claims, 15 Drawing Sheets

(56) References Cited

U.S. PATENT DOCUMENTS

| | | |
|---|---|---|
| 8,716,859 B2 | 5/2014 | Meyer et al. |
| 8,993,380 B2 | 3/2015 | Hou et al. |
| 9,633,979 B2 | 4/2017 | Mohammed et al. |
| 9,831,219 B2 | 11/2017 | Chuang et al. |
| 10,050,024 B2 | 8/2018 | Hung et al. |
| 10,249,585 B2 | 4/2019 | Yeh et al. |
| 11,217,564 B2* | 1/2022 | Choi .................. H01L 23/5381 |
| 2010/0044861 A1 | 2/2010 | Chiu et al. |
| 2020/0105701 A1* | 4/2020 | Li ....................... H01L 21/4853 |
| 2020/0273800 A1* | 8/2020 | Kim ...................... H01L 24/17 |
| 2021/0143128 A1* | 5/2021 | Choi ..................... G11C 5/025 |
| 2022/0352124 A1* | 11/2022 | Kim ...................... H01L 24/16 |
| 2023/0047345 A1* | 2/2023 | Hwang ............. H01L 23/49822 |

\* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0098041 filed on Jul. 26, 2021, in the Korean Intellectual Property Office, the disclosure of which is hereby incorporated by reference in its entirety.

BACKGROUND

The present disclosure relates to a semiconductor package and a method of fabricating the same.

Portable devices have been increasingly demanded in recent electronic product markets, and as a result, it has been ceaselessly required for reduction in size and weight of electronic parts mounted on the portable devices. In particular, there is a continuous increase in need for excellent performance memory devices, and it is required to achieve high bandwidth or high processing capacity.

In order to accomplish the reduction in size and weight of the electronic parts, there is need for technology to integrate a number of individual devices into a single package as well as technology to reduce individual sizes of mounting parts. In particular, semiconductor packages operated at high frequency signals are required to have compactness and excellent electrical characteristics.

In general, a TSV process, a flip chip process, and a wire bonding process may be employed to stack a plurality of memory chips on a package substrate. However, there is a problem that the TSV process is complex and excessively expensive, and thus a certain process may be needed to solve the problem mentioned above.

SUMMARY

Some embodiments of the present disclosure provide a semiconductor package with increased structural stability and improved electrical properties and a method of fabricating the same.

Some embodiments of the present disclosure provide a structurally simple and compact semiconductor package and a method of fabricating the same.

Some embodiments of the present disclosure provide a method of fabricating a semiconductor package with a reduced occurrence of defects and a semiconductor package fabricated by the same.

According to some embodiments of the present disclosure, a semiconductor package may include: a first semiconductor chip mounted on a substrate; a buried solder ball on the substrate and spaced apart from the first semiconductor chip; a first molding layer on the substrate to encapsulate the first semiconductor chip and the buried solder ball, the first molding layer exposing the first semiconductor chip and the buried solder ball and a top surface of the first molding layer being coplanar with a top surface of the first semiconductor chip; a second semiconductor chip on the first molding layer, the second semiconductor chip vertically overlapping the buried solder ball and a portion of the first semiconductor chip; and a second molding layer on the first molding layer to cover the second semiconductor chip. The second semiconductor chip may be supported on the first semiconductor chip through a dummy solder ball between the first semiconductor chip and the second semiconductor chip. The second semiconductor chip may be connected to the buried solder ball through a signal solder ball between the buried solder ball and the second semiconductor chip.

According to some embodiments of the present disclosure, a semiconductor package may include: a substrate; a first semiconductor chip and a second semiconductor chip that are sequentially stacked on the substrate, the first and second semiconductor chips being shifted from each other to partially expose an active surface of the second semiconductor chip; a first molding layer on the substrate and surrounding the first semiconductor chip; a second molding layer on the first molding layer and surrounding the second semiconductor chip; a redistribution layer on the active surface of the second semiconductor chip; a vertical connection structure that penetrates the first and second molding layers and connects the redistribution layer to the substrate; a first terminal between the substrate and an active surface of the first semiconductor chip, the first terminal electrically connecting the first semiconductor chip to the substrate; a second terminal between the redistribution layer and an inactive surface of the first semiconductor chip, the second terminal supporting the second semiconductor chip on the first semiconductor chip; and a plurality of external terminals below the substrate. The vertical connection structure may include: a first solder part in the first molding layer; and a second solder part in the second molding layer and connected to an upper portion of the first solder part. The second semiconductor chip may be electrically connected to the substrate through the redistribution layer and the vertical connection structure. A top surface of the first molding layer may be coplanar with the inactive surface of the first semiconductor chip.

According to some embodiments of the present disclosure, a method of fabricating a semiconductor package may include: mounting a first semiconductor chip on a substrate; providing a first solder on a substrate pad of the substrate on one side of the first semiconductor chip; forming a first molding layer on the substrate to encapsulate the first semiconductor chip and the first solder; allowing the first molding layer to undergo a grinding process to remove an upper portion of the first molding layer to expose the first semiconductor chip and the first solder; placing the second semiconductor chip on the first molding layer to allow a second solder of the second semiconductor chip to contact the first solder and to allow a third solder of the second semiconductor chip to contact a top surface of the first semiconductor chip; performing a reflow process to form a vertical connection structure in which the first solder is bonded to the second solder; and forming a second molding layer on the first molding layer to encapsulate the second semiconductor chip.

DETAILED DESCRIPTION OF EMBODIMENTS

The following will now describe a semiconductor package according to the present disclosure with reference to the accompanying drawings.

Figure 1:
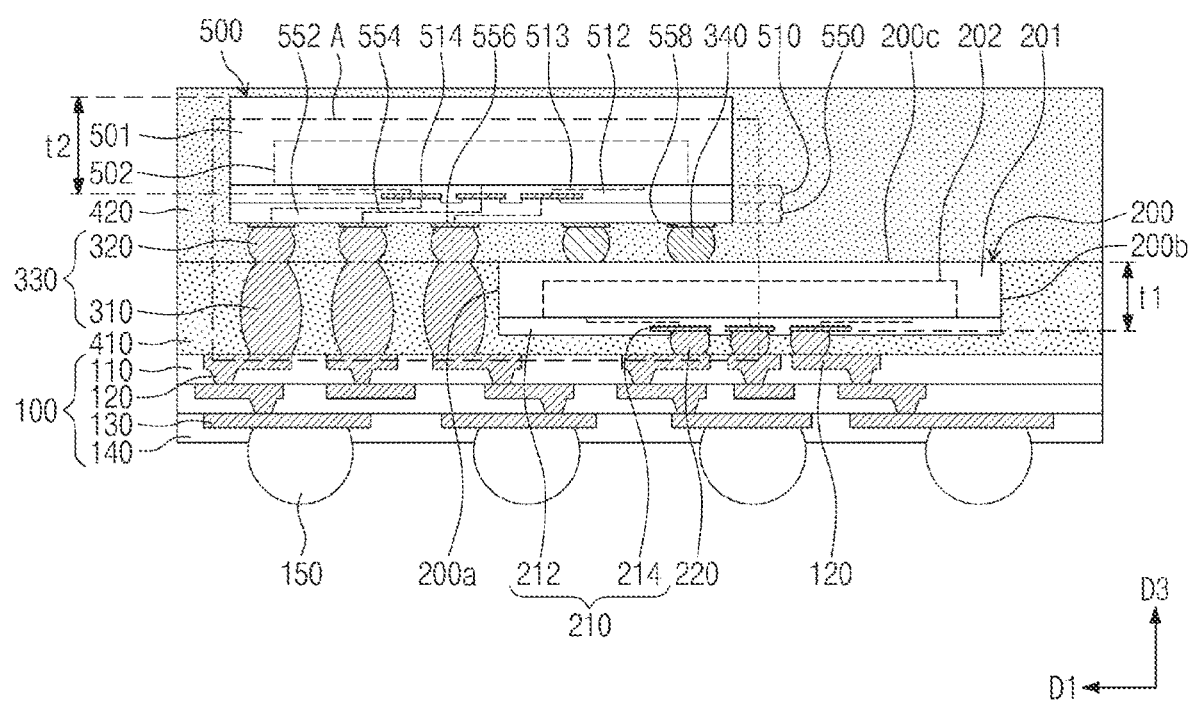
FIG. 1 illustrates a cross-sectional view showing a semiconductor package according to some embodiments of the present disclosure.
Figure 2:
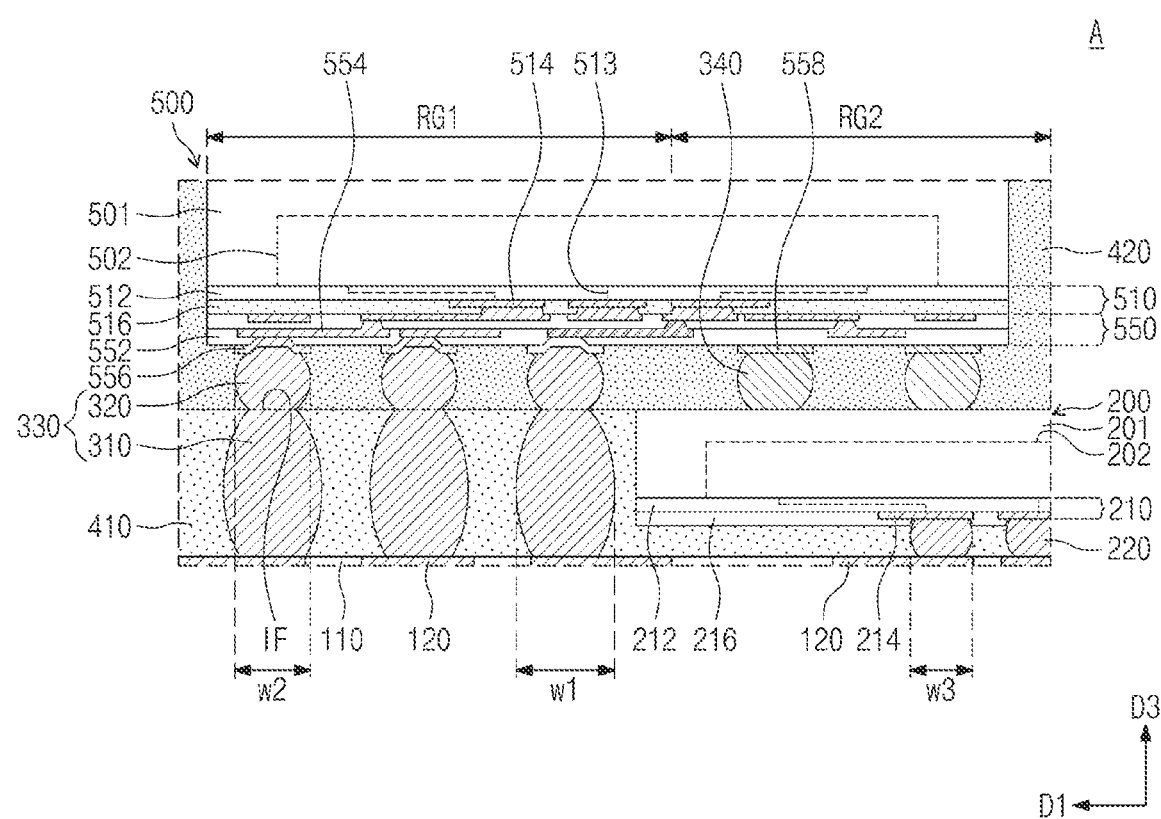
FIG. 2 illustrates an enlarged view showing section A of FIG. 1.
Figure 3:
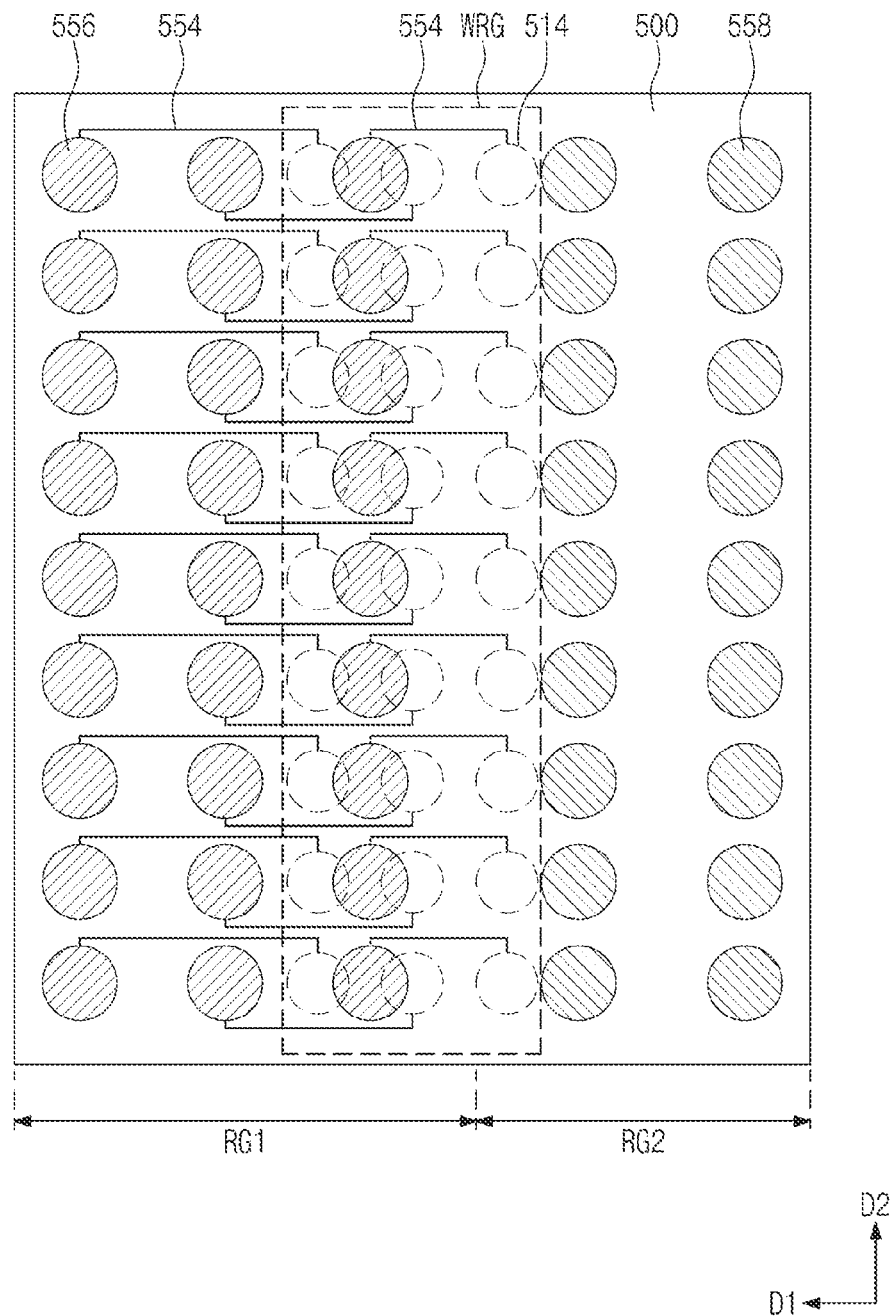
FIG. 3 illustrates a plan view showing a semiconductor package according to some embodiments of the present disclosure.
Figure 4:
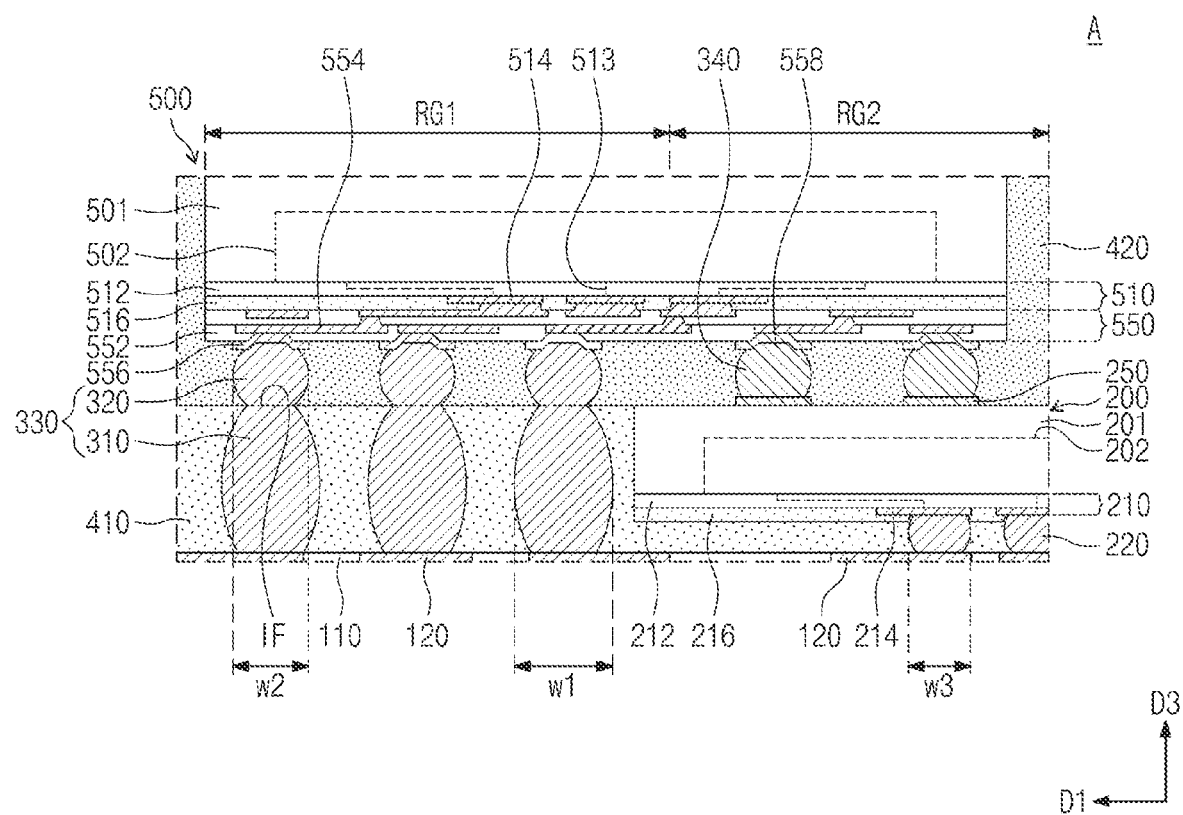
FIG. 4 illustrates an enlarged view showing section A of FIG. 1.
Figure 5:
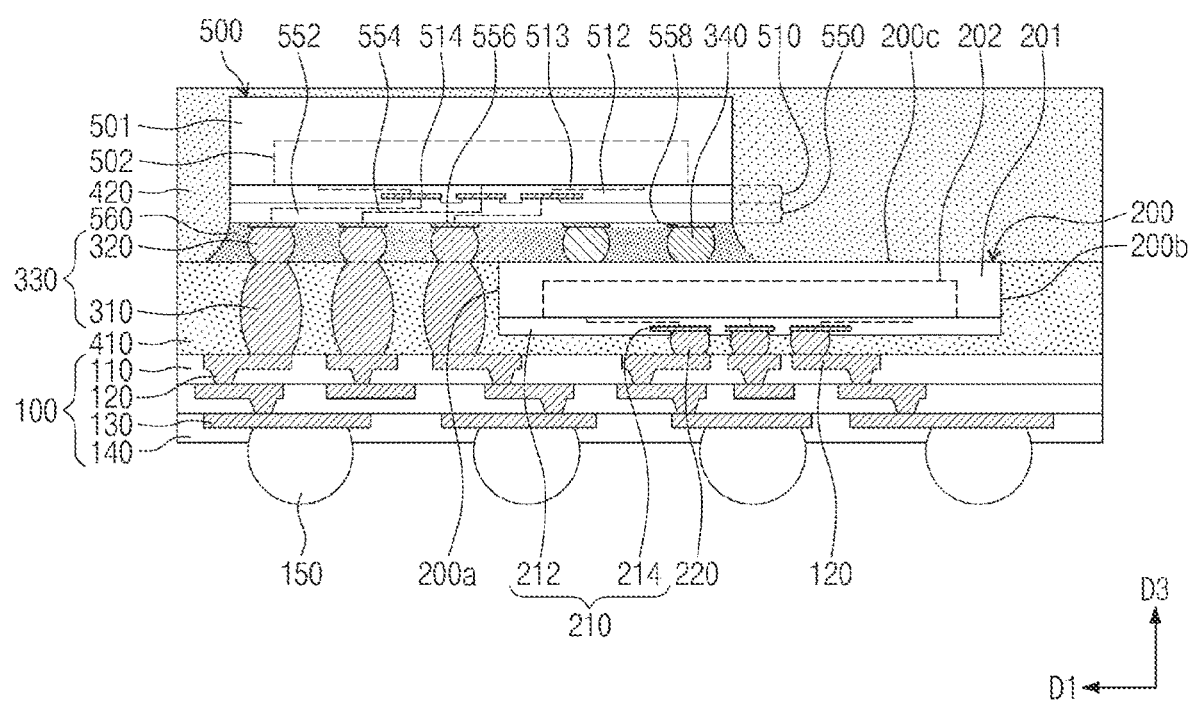
FIGS. 5 to 8 illustrate cross-sectional views showing a semiconductor package according to some embodiments of the present disclosure.

FIG. 1 illustrates a cross-sectional view showing a semiconductor package according to some embodiments of the present disclosure. FIG. 2 illustrates an enlarged view showing section A of FIG. 1. FIG. 3 illustrates a plan view showing a semiconductor package according to some embodiments of the present disclosure. FIG. 4 illustrates an enlarged view showing section A of FIG. 1. FIG. 5 illustrates a cross-sectional view showing a semiconductor package according to some embodiments of the present disclosure.

Referring to FIGS. 1 and 2, a package substrate 100 may be provided. The package substrate 100 may be a redistribution substrate. For example, the package substrate 100 may include one or more substrate wiring layers that are stacked on each other. Each of the substrate wiring layers may include a substrate dielectric layer 110 and a substrate wiring pattern 120 in the substrate dielectric layer 110. The substrate wiring pattern 120 of one of the substrate wiring layers may be electrically connected to the substrate wiring pattern 120 of a neighboring substrate wiring layer.

The substrate dielectric layer 110 may include a dielectric polymer or a photo-imagable dielectric (PID) polymer. For example, the photo-imagable dielectric polymer may include one or more of photosensitive polyimide, polybenzoxazole (PBO), phenolic polymers, and benzocyclobutene polymers.

The substrate wiring pattern 120 may be provided in the substrate dielectric layer 110. The substrate wiring pattern 120 may horizontally extend in the substrate dielectric layer 110. For example, the substrate wiring pattern 120 may be one of a pad part and a line part of the substrate wiring layer. In this case, the substrate wiring pattern 120 may be a component for horizontal redistribution in the package substrate 100. The substrate wiring pattern 120 may be provided on an upper portion of the substrate dielectric layer 110. The substrate wiring pattern 120 may have a top surface that is exposed on a top surface of the substrate dielectric layer 110. The substrate wiring pattern 120 provided at an uppermost substrate wiring layer may serve as a substrate pad coupled to one of a first semiconductor chip 200 and a first connection terminal 310 which will be discussed below. The substrate wiring pattern 120 may include a conductive material. For example, the substrate wiring pattern 120 may include metal, such as copper (Cu).

The substrate wiring pattern 120 may have a via that protrudes onto a bottom surface thereof. The via may be a component for vertical connection between the substrate wiring patterns 120 of neighboring substrate wiring layers. Alternatively, the via may be a component for connection between an external pad 130 and the substrate wiring pattern 120 of a lowermost substrate wiring layer. For example, the via may be coupled from the bottom surface of the substrate wiring pattern 120 to the top surface of the substrate wiring pattern 120 of an underlying substrate wiring layer. Alternatively, the via may be coupled from the bottom surface of the substrate wiring pattern 120 through a lowermost substrate dielectric layer 110 to a top surface of the external pad 130.

A plurality of external pads 130 may be provided on a bottom surface of the lowermost substrate wiring layer. The external pads 130 may be electrically connected to the substrate wiring pattern 120. The external pads 130 may serve as pads to which are coupled a plurality of the external terminals 150 which will be discussed below.

A substrate protection layer 140 may be provided. The substrate protection layer 140 may cover the bottom surface of the lowermost substrate wiring layer and expose the external pads 130. The external pads 130 may be provided with external terminals 150 on exposed bottom surfaces thereof. The external terminals 150 may include a solder ball or a solder bump.

The package substrate 100 may be configured as discussed above. The present disclosure, however, is not limited thereto. The package substrate 100 may be a printed circuit board (PCB). For example, the package substrate 100 may have a core layer and peripheral parts for connection between lines on upper and lower portions of the core layer.

A first semiconductor chip 200 may be disposed on the package substrate 100. The first semiconductor chip 200 may have a front surface and a rear surface. In this description below, a front surface may be defined to refer to a surface at an active surface side on which is formed an integrated element of a semiconductor chip and a rear surface may be defined to refer to another surface opposite to the front surface. For example, the first semiconductor chip 200 may include first chip pads 214 provided on the front surface of the first semiconductor chip 200. The first semiconductor chip 200 may have a first lateral surface 200a and a second lateral surface 200b that are opposite to each other in a first direction D1. Hereinafter, a first direction D1 and a second direction D2 are defined to each indicate a direction parallel to a top surface of the package substrate 100 and a third direction D3 is defined to indicate a direction perpendicular to the top surface of the package substrate 100. The first lateral surface 200a may be a lateral surface in the first direction D1 of the first semiconductor chip 200, and the second lateral surface 200b may be a lateral surface of the first semiconductor chip 200 in a direction reverse to the first direction D1. The first semiconductor chip 200 may be a memory chip, such as dynamic random-access memory (DRAM), static random-access memory (SRAM), magnetic random-access memory (MRAM), or Flash memory. Alternatively, the first semiconductor chip 200 may be a logic chip, a passive device, or any other suitable semiconductor chip. The first semiconductor chip 200 may include a semiconductor material, such as silicon (Si).

The first semiconductor chip 200 may have a first base layer 201 on which is formed a first integrated circuit 202 of the first semiconductor chip 200 and may also have a first chip wiring layer 210 provided on one surface on which the first integrated circuit 202 is formed in the first base layer 201. The first chip wiring layer 210 may include a first chip dielectric pattern 212, first chip pads 214 that are connected to the first integrated circuit 202 through a wiring pattern in the first chip dielectric pattern 212, and a first chip passivation layer 216 that exposes the first chip pads 214 on the first chip dielectric pattern 212.

The first chip dielectric pattern 212 may be disposed on a bottom surface of the first base layer 201, covering the first integrated circuit 202. The first chip dielectric pattern 212 may be provided in plural, and the plurality of first chip dielectric patterns 212 may be stacked on each other. In this case, the first chip dielectric patterns 212 may be wiring layers that are vertically connected to each other. The first chip dielectric patterns 212 may include silicon oxide (SiO), silicon nitride (SiN), or silicon oxynitride (SiON). As indicated by dotted lines depicted in FIG. 1, the first chip dielectric pattern 212 may be provided with one or more wiring patterns therein. The wiring pattern may be a component for horizontal redistribution of the first integrated circuit 202 in the first semiconductor chip 200. For example, the wiring pattern may penetrate the first chip dielectric pattern 212 and connect with the first integrated circuit 202.

The first chip pads 214 may be provided on a bottom surface of the first chip dielectric pattern 212. The first chip pads 214 may be provided on a central portion of the first semiconductor chip 200. The first chip pads 214 may be coupled through the wiring pattern to the first integrated circuit 202. The first chip pads 214 may include a metallic material, such as aluminum (Al).

The first chip passivation layer 216 may be provided on the bottom surface of the first chip dielectric pattern 212. The first chip passivation layer 216 may cover the first chip pads 214 on the bottom surface of the first chip dielectric pattern 212 and may have openings that expose portions of bottom surfaces of the first chip pads 214. The first chip passivation layer 216 may include a photosensitive polymer, such as polyimide.

The first semiconductor chip 200 may be flip-chip mounted on the package substrate 100. For example, the first semiconductor chip 200 may be placed to allow the first chip pads 214 to face the package substrate 100. In this case, the first semiconductor chip 200 may be placed to allow its front surface to face the package substrate 100. A plurality of first chip terminals 220 may be provided between the package substrate 100 and the first chip pads 214. The first chip terminals 220 may penetrate the first chip passivation layer 216 and may be coupled to the first chip pads 214. For example, in the openings of the first chip passivation layer 216, the first chip terminals 220 may be coupled to the first chip pads 214. The first semiconductor chip 200 may be connected to the package substrate 100 through the first chip pads 214, the first chip terminals 220, and the substrate wiring pattern 120. The first chip terminals 220 may include a solder ball or a solder bump.

The package substrate 100 may be provided thereon with first connection terminals 310. The first connection terminals 310 may be disposed on one side in the first direction D1 from the first semiconductor chip 200. For example, the first connection terminals 310 may be disposed adjacent to the first lateral surface 200a of the first semiconductor chip 200. The first connection terminals 310 may be coupled to the substrate wiring pattern 120 of the package substrate 100. The first connection terminals 310 may include a solder ball or a solder bump. The first connection terminals 310 may have their spherical shapes and flat top surfaces. For example, the first connection terminals 310 may each have a cylindrical shape whose width increases with increasing distance from top and bottom surfaces thereof. The top surfaces of the first connection terminals 310 may be located at the same level from the package substrate 100 as that of a top surface 200c of the first semiconductor chip 200.

A first molding layer 410 may be provided on the package substrate 100. The first molding layer 410 may cover the top surface of the package substrate 100. The first molding layer 410 may surround the first semiconductor chip 200 and the first connection terminals 310. The first molding layer 410 may protect the first semiconductor chip 200. For example, the first molding layer 410 may cover lateral surfaces of the first semiconductor chip 200. The first molding layer 410 may fill a space between the package substrate 100 and the first semiconductor chip 200. The first molding layer 410 may surround the first chip terminals 220 between the package substrate 100 and the first semiconductor chip 200. The first molding layer 410 may cover lateral surfaces of the first connection terminals 310. For example, the first connection terminals 310 may be buried solder balls that are embedded in the first molding layer 410. The first molding layer 410 may expose the top surface 200c of the first semiconductor chip 200 and the top surfaces of the first connection terminals 310. The first molding layer 410 may have a top surface coplanar with the top surface 200c of the first semiconductor chip 200 and the top surfaces of the first connection terminals 310, and the top surfaces of the molding layer 410, the first semiconductor chip 200, and the first connection terminals 310 may be substantially flat. The first molding layer 410 may include a dielectric material, such as polyimide, whose cuttability is excellent. Alternatively, the first molding layer 410 may include a dielectric material. For example, the first molding layer 410 may include an epoxy molding compound (EMC).

According to some embodiments, a first under-fill part may be provided between the first semiconductor chip 200 and the package substrate 100. The first under-fill part may include a non-conductive film (NCF). For example, the first under-fill part may be a polymer tape including a dielectric material. Alternatively, the first under-fill part may include a fluidic adhesive member. The first under-fill part may fill a space between the package substrate 100 and the first semiconductor chip 200 and may surround the first chip terminals 220. The first under-fill part may be interposed between the first chip terminals 220 to prevent the occurrence of a short between the first chip terminals 220. The first under-fill part may partially protrude onto lateral surfaces of the first semiconductor chip 200. In this case, on the package substrate 100, the first molding layer 410 may surround both the first under-fill part and the first semiconductor chip 200.

A second semiconductor chip 500 may be disposed on the first molding layer 410. The second semiconductor chip 500 may be disposed on the rear surface of the first semiconductor chip 200. The second semiconductor chip 500 and the first semiconductor chip 200 may be disposed in an offset stack structure. For example, the first semiconductor chip 200 and the second semiconductor chip 500 may be stacked obliquely in the first direction D1, which may result in an ascending stepwise shape. When viewed in a plan view, a portion of the second semiconductor chip 500 may overlap the first semiconductor chip 200 and another portion of the second semiconductor chip 500 may protrude beyond the first lateral surface 200a of the first semiconductor chip 200. The second semiconductor chip 500 may be stacked on the first semiconductor chip 200 such that the second semiconductor chip 500 may be shifted in the first direction D1 from the first semiconductor chip 200. In this case, the protruding portion onto the first lateral surface 200a of the first semiconductor chip 200 may be positioned on one or more first connection terminals 310. For example, when viewed from the bottom of a semiconductor package, an active surface of the second semiconductor chip 500 may be partially exposed without being covered with the first semiconductor chip 200. A front surface, or a bottom surface, of the second semiconductor chip 500 may be substantially parallel to the top surface of the package substrate 100.

The second semiconductor chip 500 may be configured substantially identical or similar to the first semiconductor chip 200. For example, the second semiconductor chip 500 may be of the same type as the first semiconductor chip 200. The second semiconductor chip 500 may include a second base layer 501 in which is formed a second integrated circuit 502 of the second semiconductor chip 500 and may also include a second chip wiring layer 510 provided on one surface on which the second integrated circuit 502 is formed in the second base layer 501. The second chip wiring layer 510 may include a second chip dielectric pattern 512, second chip pads 514 connected to the second integrated circuit 502 through internal lines in the second chip dielectric pattern 512, and a second chip passivation layer 516 that exposes the second chip pads 514 on the second chip dielectric pattern 512.

On a bottom surface of the second base layer 501, the second chip dielectric pattern 512 may cover the integrated circuit 502. The second chip dielectric pattern 512 may be provided in plural, and the plurality of second chip dielectric patterns 512 may be stacked on each other. In this case, the second chip dielectric patterns 512 may be wiring layers that are vertically connected to each other. The second chip dielectric patterns 512 may include silicon oxide (SiO), silicon nitride (SiN), or silicon oxynitride (SiON).

The second chip pads 514 may be provided on a bottom surface of the second chip dielectric pattern 512. The second chip pads 514 may be provided on a central portion of the second semiconductor chip 500. For example, as shown in FIG. 3, the second chip pads 514 may be arranged in the second direction D2 on the central portion of the second semiconductor chip 500. The second chip pads 514 may include a metallic material, such as aluminum (Al).

A second chip wiring pattern 513 may be provided in the second chip dielectric pattern 512. The second chip wiring pattern 513 may horizontally extend in the second chip dielectric pattern 512. For example, the second chip wiring pattern 513 may be a component for horizontal redistribution of the second integrated circuit 502 in the second semiconductor chip 500. The second chip wiring pattern 513 may connect the second integrated circuit 502 to the second chip pads 514.

The second chip passivation layer 516 may be provided on the bottom surface of the second chip dielectric pattern 512. The second chip passivation layer 516 may encapsulate the second chip pads 514 on the bottom surface of the second chip dielectric pattern 512 and may have openings that partially expose bottom surfaces of the second chip pads 514. The second chip passivation layer 516 may include a photosensitive polymer, such as polyimide.

The second semiconductor chip 500 may be disposed to allow the second chip pads 514 to face the first molding layer 410. For example, the second semiconductor chip 500 may be placed to allow the front surface of the second semiconductor chip 500 to face the molding layer 410. The second semiconductor chip 500 may be a memory chip. Alternatively, the second semiconductor chip 500 may be a logic chip, a passive device, or any other suitable semiconductor chip. The second semiconductor chip 500 may include a semiconductor material, such as silicon (Si). The second semiconductor chip 500 may have a thickness less than that of the first semiconductor chip 200. Alternatively, a first thickness t1 between a top surface of the first base layer 201 and the bottom surfaces of the first chip pads 214 may be less than a second thickness t2 between a top surface of the second base layer 501 and the bottom surfaces of the second chip pads 514. For example, the first thickness t1 of the first semiconductor chip 200 may range from about 100 µm to about 200 µm. The second thickness t2 of the second semiconductor chip 500 may range from about 200 µm to about 500 µm.

The second semiconductor chip 500 may further include a first redistribution layer 550 provided on the front surface of the second semiconductor chip 500. For example, the first redistribution layer 550 may be provided on the bottom surface of the second semiconductor chip 500 and may cover the second base layer 501 and the second chip wiring layer 510. The first redistribution layer 550 may include a first dielectric pattern 552 stacked on the bottom surface of the second semiconductor chip 500, a first wiring pattern 554 provided in the first dielectric pattern 552, and first signal pads 556 and first dummy pads 558 exposed on a bottom surface of the first redistribution layer 550.

The first dielectric pattern 552 may cover a bottom surface of the second chip wiring layer 510. The first dielectric pattern 552 may include a plurality of dielectric layers that are stacked on each other. The first dielectric pattern 552 may include a dielectric material. For example, the first dielectric pattern 552 may include a dielectric polymer. The first dielectric pattern 552 may include at least one selected from photosensitive polyimide, polybenzoxazole (PBO), phenolic polymers, and benzocyclobutene polymers.

The first signal pads 556 and the first dummy pads 558 may be provided below the first dielectric pattern 552. The first signal pads 556 and the first dummy pads 558 may be exposed on a bottom surface of the first dielectric pattern 552. In this case, the first signal pads 556 and the first dummy pads 558 may extend or protrude onto the bottom surface of the first dielectric pattern 552. For example, each of the first signal and dummy pads 556 and 558 may have a portion that is positioned on the bottom surface of the first dielectric pattern 552 and may also have another portion that penetrates the first dielectric pattern 552 and are connected to the first wiring pattern 554 in the first dielectric pattern 552. Alternatively, the first signal pads 556 and the first dummy pads 558 may have their bottom surfaces coplanar with the bottom surface of the first dielectric pattern 552. The bottom surfaces of the first signal pads 556 and of the first dummy pads 558 may be located at the same level as that of the top surface of the package substrate 100. The first signal pads 556 and the first dummy pads 558 may be under bump pads that are exposed on a lowermost surface of the first redistribution layer 550. The first signal pads 556 may be connection pads for externally transceiving electrical signals with the second integrated circuit 502 of the second semiconductor chip 500, and the first dummy pads 558 may be electrically floated from the second integrated circuit 502 of the second semiconductor chip 500. The first signal pads 556 and the first dummy pads 558 may include a conductive material. For example, the first signal pads 556 and the first dummy pads 558 may include copper (Cu).

FIG. 3 depicts the bottom surface of the second semiconductor chip 500, and for convenience of description, FIG. 3 also depicts positions of the second chip pads 514 in the second semiconductor chip 500.

FIGS. 1 to 3, the second semiconductor chip 500 may have a first region RG1 and a second region RG2. The first region RG1 may be positioned in the first direction D1 of the second region RG2. When viewed in a plan view, the first region RG1 of the second semiconductor chip 500 may be positioned on one side in the first direction D1 of the first semiconductor chip 200 and the second region RG2 of the second semiconductor chip 500 may be positioned on the first semiconductor chip 200. The first region RG1 of the second semiconductor chip 500 may be defined to refer to an area where the first signal pads 556 are provided, and the second region RG2 of the second semiconductor chip 500 may be defined to refer to an area where the first dummy pads 558 are provided.

The first signal pads 556 may be disposed on the first region RG1 on the front surface of the second semiconductor chip 500. The first signal pads 556 may constitute at least one column that extends along the first lateral surface 200a of the first semiconductor chip 200 on the first region RG1. For example, the first signal pads 556 may constitute at least one column that extends along the second direction D2 on the first region RG1. When viewed in a plan view, each of the first signal pads 556 may be spaced apart from the first semiconductor chip 200.

The first dummy pads 558 may be disposed on the front surface of the second semiconductor chip 500 on the second region RG2. The first dummy pads 558 may constitute at least one column that extends along the second direction D2 on the second region RG2. Each of the first dummy pads 558 may vertically overlap the first semiconductor chip 200. A plurality of columns that are constituted by the first dummy pads 558 may be spaced apart from each other in the first direction D1. FIG. 3 depicts that the first dummy pads 558 are arranged along the second direction D2, but the present disclosure is not limited thereto. An arrangement of the first dummy pads 558 may be variously changed based on positions and weights of the first semiconductor chip 200 and the second semiconductor chip 500.

The first wiring pattern 554 may be provided within the first dielectric pattern 552. The first wiring pattern 554 may be coupled to the second chip pads 514 after penetrating the second chip passivation layer 516 of the second chip wiring layer 510 and may electrically connect the second chip pads 514 to the first signal pads 556.

The second chip wiring layer 510 and the first wiring pattern 554 may cause the second integrated circuit 502 of the second semiconductor chip 500 to have electrical connection with the first signal pads 556. For example, as shown in FIG. 3, the first redistribution layer 550 may have a window region WRG positioned on a top surface thereof. The window region WRG may extend in the second direction D2 on a central portion of the first redistribution layer 550. When viewed in a plan view, the window region WRG may the same as an area where the second chip pads 514 are disposed and the area may be defined to indicate a section where the first wiring pattern 554 and the second chip pads 514 are coupled at an interface between the first redistribution layer 550 and the second chip wiring layer 510. For example, on the window region WRG, the first wiring pattern 554 may be exposed on a top surface of the first dielectric pattern 552 or the top surface of the first redistribution layer 550 and the exposed first wiring pattern 554 may be in contact with the second chip pads 514.

As shown in FIG. 2, the first wiring pattern 554 may be electrically insulated from the first dummy pads 558. For example, the first dummy pads 558 may be positioned on the bottom surface of the first dielectric pattern 552 and the first dielectric pattern 552 may separate the first dummy pads 558 from the first wiring pattern 554. The second integrated circuit 502 of the second semiconductor chip 500 may be electrically insulated from the first dummy pads 558. Alternatively, as shown in FIG. 4, portions of the first wiring pattern 554 may be connected to the first dummy pads 558. In this case, the portions of the first wiring pattern 554 connected to the first dummy pads 558 may be electrically floated from the second chip pads 514. Therefore, the second integrated circuit 502 of the second semiconductor chip 500 may be electrically insulated from the first dummy pads 558.

The second semiconductor chip 500 may be flip-chip mounted on the package substrate 100. For example, second connection terminals 320 may be provided between the first molding layer 410 and the first signal pads 556. The second connection terminals 320 may be connected to the first connection terminals 310. For example, each of the second connection terminals 320 may be connected to one of the first connection terminals 310, thereby constituting one of first vertical connection terminals 330. In this case, the first connection terminals 310 may be first solder parts that constitute lower portions of the first vertical connection terminals 330 and the second connection terminals 320 may be second solder parts that constitute upper portions of the first vertical connection terminals 330. For example, the first connection terminal 310 and the second connection terminal 320 may constitute a single unitary body formed of the same material. The first connection terminal 310 and the second connection terminal 320 may be a portion of the first vertical connection terminal 330 formed of one material. For example, the first vertical connection terminals 330 that penetrate the first and second molding layers 410 and 420 may have the first connection terminals positioned in the first molding layer 410 and the second connection terminals positioned on the first molding layer 410. Thus, the first vertical connection terminal 330 may be a component obtained when the first connection terminal 310 and the second connection terminal 320 are connected to each other. There may be an invisible interface IF between the first connection terminal 310 and the second connection terminal 320. Alternatively, the first and second connection terminals 310 and 320 may be formed of different materials from each other. For example, a material of the first connection terminal 310 and a material of the second connection terminals 320 may be partially different across an interface between the first connection terminal 310 and the second connection terminal 320. In this case, there may be a visible interface IF between the first connection terminal 310 and the second connection terminal 320. The interface IF between the first and second connection terminals 310 and 320 may be coplanar with the top surface of the first molding layer 410. The second connection terminals 320 may include a solder ball or a solder bump. The second connection terminals 320 may have their spherical shapes with flat bottom surfaces. For example, the second connection terminals 320 may each have a cylindrical shape whose width increases with increasing distance from top and bottom surfaces thereof. The first connection terminals 310 may have a height greater than that of the second connection terminals 320. The height of the first connection terminals 310 may be greater than that of the first semiconductor chip 200, and the height of the second connection terminals 320 may be less than that of the first semiconductor chip 200 and that of the second semiconductor chip 500. The second connection terminals 320 may each have a second width w2 less than a first width w1 of each of the first connection terminals 310. Based on shapes of the first and second connection terminals 310 and 320, the first vertical connection terminal 330 may have a vertical cross-section shaped like a roly-poly toy or a tumbling doll. The second width w2 of each of the second connection terminals 320 may be the same as or greater than a third width w3 of each of the first chip terminals 220.

The first vertical connection terminals 330 may connect the first signal pads 556 to the substrate wiring pattern 120 of the package substrate 100. The second semiconductor chip 500 may be connected to the package substrate 100 through the first signal pads 556, the first vertical connection terminals 330, and the substrate wiring pattern 120. The first vertical connection terminals 330 may be disposed on one side in the first direction D1 from the first semiconductor chip 200. For example, the first vertical connection terminals 330 may be disposed adjacent to the first lateral surface 200a of the first semiconductor chip 200. The first vertical connection terminals 330 may be correspondingly provided on the first signal pads 556. The first vertical connection terminals 330 may be coupled to the substrate wiring pattern 120 of the package substrate 100. Therefore, the second integrated circuit 502 of the second semiconductor chip 500 may be electrically connected to the package substrate 100 through the first redistribution layer 550, the first signal pads 556, and the first vertical connection terminals 330.

On the second region RG2, third connection terminals 340 may be provided between the first dummy pads 558 and the rear surface of the first semiconductor chip 200. The first semiconductor chip 200 may be provided on its rear surface with the third connection terminals 340 that support the second semiconductor chip 500. The third connection terminals 340 may be in direct contact with the rear surface of the first semiconductor chip 200 or with the top surface of the first base layer 201. The third connection terminals 340 may have a height substantially the same as that of the second connection terminals 320. The third connection terminals 340 may have their width and height the same as or greater than the third width w3 and the height of the first chip terminals 220 and less than the first width w1 and the height of the first connection terminals 310. The third connection terminals 340 may include a solder ball or a solder bump.

The third connection terminals 340 may be electrically insulated from the second semiconductor chip 500. As shown in FIG. 2, the first dummy pads 558 may be electrically insulated from the second integrated circuit 502 of the second semiconductor chip 500 and the third connection terminals 340 may also be electrically insulated from the second integrated circuit 502 of the second semiconductor chip 500. For example, the third connection terminals 340 may be dummy solders that electrically connect with neither the second semiconductor chip 500 nor the first semiconductor chip 200.

According to some embodiments of the present disclosure, as the first semiconductor chip 200 and the second semiconductor chip 500 are disposed to vertically overlap each other, the first and second semiconductor chips 200 and 500 may have a reduced occupying planar area and a compact-sized semiconductor package may be provided. The second semiconductor chip 500 may be directly connected to the package substrate 100 through the first vertical connection terminals 330 each of which is formed of one conductor, and thus it may be possible to reduce a length for electrical connection between the second semiconductor chip 500 and the package substrate 100 and to provide a semiconductor package with improved electrical properties. As the first vertical connection terminals 330 are formed using solder balls that are easily manufactured at low cost, it may be possible to simplify fabrication process for semiconductor package and to cut down the manufacturing cost for semiconductor package.

Moreover, as the second semiconductor chip 500 is supported through the third connection terminals 340 on the first semiconductor chip 200, a semiconductor package may be provided to have increased structural stability. The third connection terminals 340 may be disposed regardless of wiring connection of the first semiconductor chip 200 and/or regardless of wiring connection of the second semiconductor chip 500, and an arrangement of the third connection terminals 340 may be variously changed based on shape and thickness of the second semiconductor chip 500. Accordingly, the second semiconductor chip 500 may be stably supported on the first semiconductor chip 200, and a semiconductor package may be provided to have increased structural stability.

In some embodiments, as shown in FIG. 4, the first semiconductor chip 200 may include upper pads 250. The upper pads 250 may be provided on the top surface (see 200c of FIG. 1) of the first semiconductor chip 200. The upper pads 250 may be disposed on the second region RG2 of the second semiconductor chip 500. For example, the upper pads 250 may have their positions that vertically correspond to those of the third connection terminals 340 of the second semiconductor chip 500. In this case, one upper pad 250 and one first dummy pad 558 may vertically overlap each other. The upper pads 250 may include a metallic material, such as copper (Cu). The third connection terminals 340 may connect the upper pads 250 to the first dummy pads 558.

Referring back to FIGS. 1 to 3, a second molding layer 420 may be provided on the package substrate 100. The second molding layer 420 may cover the first molding layer 410. On the first molding layer 410, the second molding layer 420 may encapsulate the second connection terminals 320, the third connection terminals 340, and the second semiconductor chip 500. For example, the second molding layer 420 may cover lateral and top surfaces of the second semiconductor chip 500. Differently from that shown, the second molding layer 420 may expose the top surface of the second semiconductor chip 500. The second molding layer 420 may fill a space between the first molding layer 410 and the second semiconductor chip 500. For example, the second molding layer 420 may surround the second and third connection terminals 320 and 340 between the first molding layer 410 and the second semiconductor chip 500. The second molding layer 420 may be in contact with lateral surfaces of the second connection terminals 320 and lateral surfaces of the third connection terminals 340. The second molding layer 420 may extend into a gap between the first semiconductor chip 200 and the package substrate 100, thereby encapsulating the first chip terminals 220. An interface between the first and second molding layers 410 and 420 may be coplanar with the interface IF between the first and second connection terminals 310 and 320.

According to some embodiments, as shown in FIG. 5, a second under-fill part 560 may be provided between the second semiconductor chip 500 and the first molding layer 410. The second under-fill part 560 may include a non-conductive film (NCF). For example, the second under-fill part 560 may be a polymer tape including a dielectric material. Alternatively, the second under-fill part 560 may include a fluidic adhesive member. The second under-fill part 560 may fill a space between the second semiconductor chip 500 and the first molding layer 410 and may surround the second connection terminals 320 and the third connection terminals 340. The second under-fill part 560 may be interposed between the second connection terminals 320 and the third connection terminals 340, thereby preventing an electrical short between the second connection terminals 320. The second under-fill part 560 may partially protrude onto the lateral surfaces of the second semiconductor chip 500. In this case, on the package substrate 100, the second molding layer 420 may surround both the second under-fill part 560 and the second semiconductor chip 500. The second under-fill part 560 may be in contact with the top surface of the first molding layer 410. The second under-fill part 560 may have a bottom surface coplanar with that of the second molding layer 420. For example, the bottom surface of the second molding layer 420 may be coplanar with an interface between the first molding layer 410 and the second molding layer 420.

According to some embodiments of the present disclosure, the second molding layer 420 may protect the second semiconductor chip 500. The second molding layer 420 may include a dielectric material. The second molding layer 420 may include a material whose rigidity is greater than that of the first molding layer 410. The second molding layer 420 may include a dielectric material having high abrasion resistance. For example, the second molding layer 420 may include an epoxy molding compound (EMC). The second molding layer 420 may have a thermal expansion coefficient different from that of the first molding layer 410. For example, the thermal expansion coefficient of the second molding layer 420 may be similar to that of the package substrate 100. Therefore, a semiconductor package may be configured such that upper and lower portions of the semiconductor package may be identical or similar to each other and may decrease in warpage. Thus, the semiconductor package may be provided to have increased structural stability.

Figure 6:
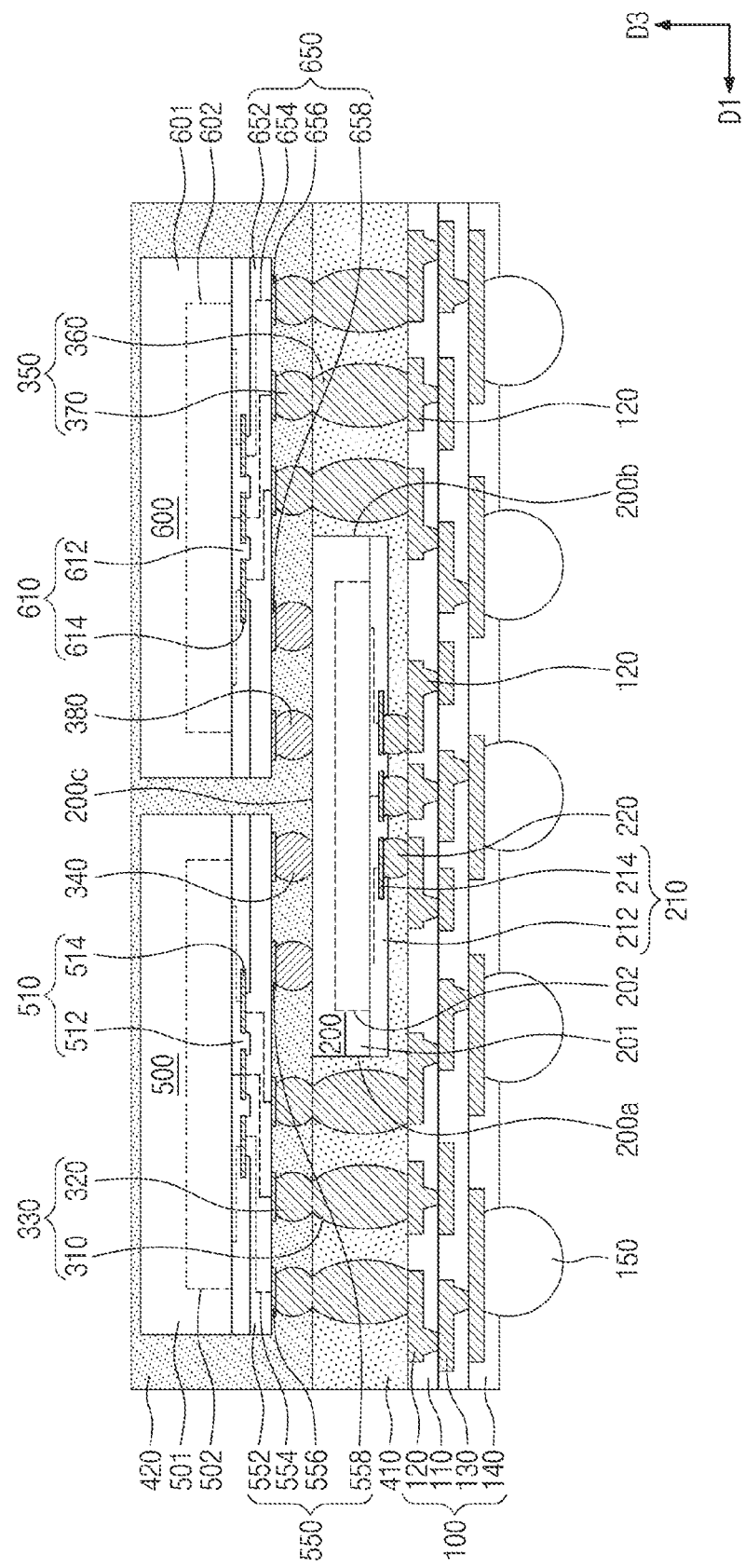
Figure 7:
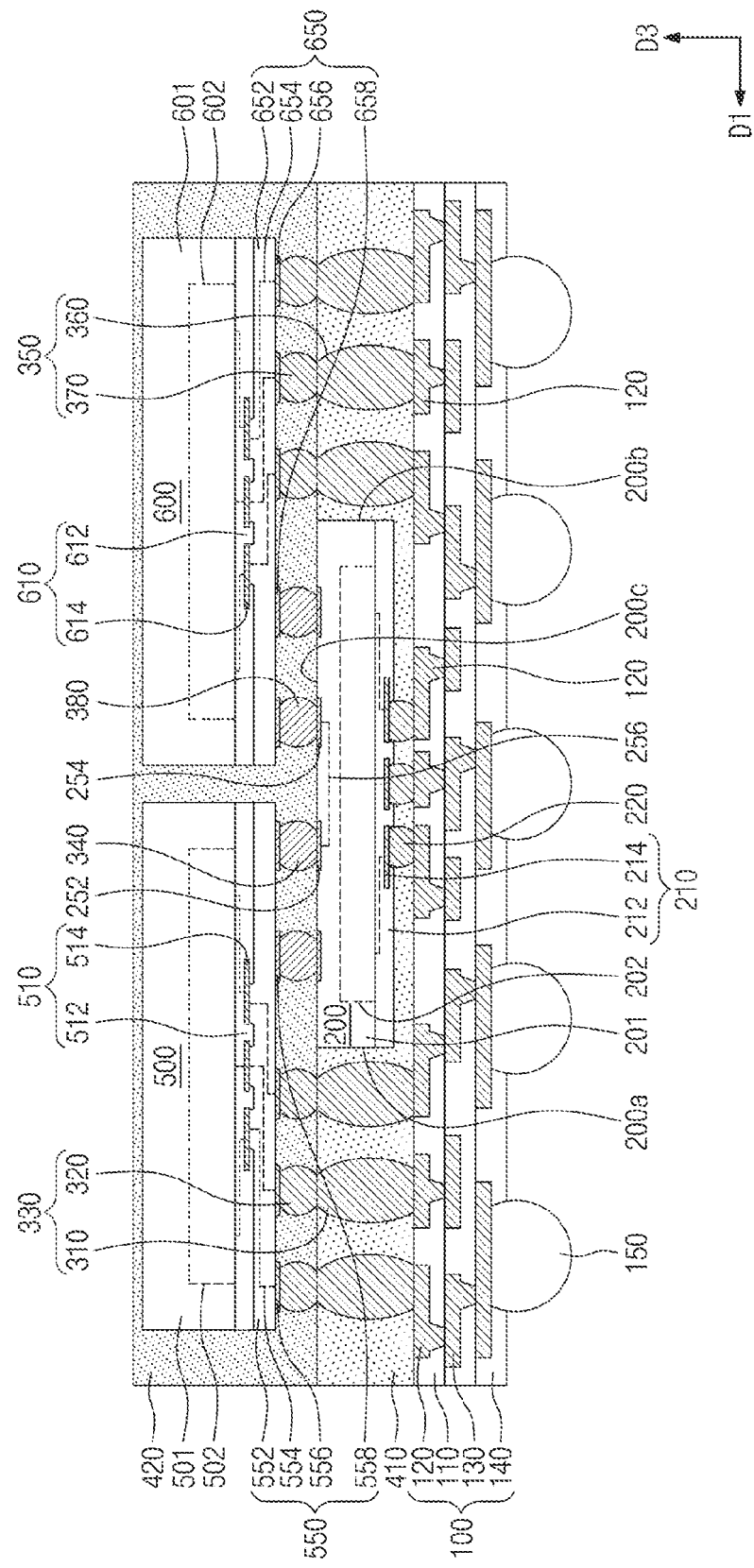

FIGS. 6 and 7 illustrate cross-sectional views showing a semiconductor package according to some embodiments of the present disclosure.

Referring to FIGS. 6 and 7, a third semiconductor chip 600 may be disposed on the first molding layer 410. The third semiconductor chip 600 may be disposed on the rear surface of the first semiconductor chip 200. The third semiconductor chip 600 may be horizontally spaced apart from the second semiconductor chip 500. The third semiconductor chip 600 and the first semiconductor chip 200 may be disposed in an offset stack structure. For example, the first semiconductor chip 200 and the third semiconductor chip 600 may be stacked obliquely in a direction reverse to the first direction D1, which may result in an ascending stepwise shape. For more detail, when viewed in s plan view, a portion of the third semiconductor chip 600 may overlap the first semiconductor chip 200 and another portion of the third semiconductor chip 600 may protrude beyond the second lateral surface 200b of the first semiconductor chip 200. Thus, the first semiconductor chip 200 may be provided thereon with the third semiconductor chip 600 that is stacked shifted from the first semiconductor chip 200 in a direction reverse to the first direction D1. The other portion of the third semiconductor chip 600 that protrudes beyond the first lateral surface 200a of the first semiconductor chip 200 may be positioned on second vertical connection terminals 350.

The third semiconductor chip 600 may be configured substantially identical or similar to the second semiconductor chip 500. In some embodiments, the third semiconductor chip 600 may be of the same type as the second semiconductor chip 500. For example, the third semiconductor chip 600 may include a third base layer 601 where is formed a third integrated circuit 602 of the third semiconductor chip 600 and may also include a third chip wiring layer 610 disposed on one surface on which the third integrated circuit 602 is formed in the third base layer 601. The third chip wiring layer 610 may include a third chip dielectric pattern 612, third chip pads 614 connected to the third integrated circuit 602 through a wiring pattern in the third chip dielectric pattern 612, and a third chip passivation layer that exposes the third chip pads 614 on the third chip dielectric pattern 612.

The third semiconductor chip 600 may further include a second redistribution layer 650 provided on a front surface of the third semiconductor chip 600. For example, the second redistribution layer 650 may be provided on a bottom surface of the third semiconductor chip 600 and may cover the third base layer 601 and the third chip wiring layer 610. The second redistribution layer 650 may include a second dielectric pattern 652 stacked on the bottom surface of the third semiconductor chip 600, a second wiring pattern 654 provided in the second dielectric pattern 652, and second signal pads 656 and second dummy pads 658 exposed on a bottom surface of the second redistribution layer 650.

The third semiconductor chip 600 may be flip-chip mounted on the package substrate 100. For example, the second vertical connection terminals 350 may be provided between the package substrate 100 and the second signal pads 656. The third semiconductor chip 600 may be connected to the package substrate 100 through the second signal pads 656, the second vertical connection terminals 350, and the substrate wiring pattern 120. The second vertical connection terminals 350 may be disposed on one side from the first semiconductor chip 200 in a direction reverse to the first direction D1. For example, the second vertical connection terminals 350 may be placed adjacent to the second lateral surface 200b of the first semiconductor chip 200. The second vertical connection terminals 350 may have fourth connection terminals 360 positioned in the first molding layer 410 and fifth connection terminals 370 positioned in the second molding layer 420. For example, the second vertical connection terminal 350 may be a component obtained when the fourth connection terminal 360 and the fifth connection terminal 370 are connected to each other. An interface between the fourth and fifth connection terminals 360 and 370 may be coplanar with an interface between the first and second molding layers 410 and 420. The fourth and fifth connection terminals 360 and 370 may include a solder ball or a solder bump. The second vertical connection terminals 350 may be coupled to the substrate wiring pattern 120 of the package substrate 100 and to the second signal pads 656 of the third semiconductor chip 600. Therefore, the third integrated circuit 602 of the third semiconductor chip 600 may be electrically connected to the package substrate 100 through the second redistribution layer 650, the second signal pads 656, and the second vertical connection terminals 350.

A plurality of sixth connection terminals 380 may be provided between the second dummy pads 658 and the rear surface of the first semiconductor chip 200. The first semiconductor chip 200 may be provided on its rear surface with the sixth connection terminals 380 that support the third semiconductor chip 600. The sixth connection terminals 380 may be in direct contact with the rear surface of the first semiconductor chip 200. The sixth connection terminals 380 may include a solder ball or a solder bump. The sixth connection terminals 380 may be electrically insulated from the third semiconductor chip 600. For example, the sixth connection terminals 380 may be dummy solders that electrically connect with neither the third semiconductor chip 600 nor the first semiconductor chip 200.

According to some embodiments of the present disclosure, as the second and third semiconductor chips 500 and 600 are disposed to vertically overlap the first semiconductor chip 200, the first, second, and third semiconductor chips 200, 500, and 600 may have a reduced occupying planar area and a compact-sized semiconductor package may be provided. Moreover, as the third semiconductor chip 600 is supported through the sixth connection terminals 380 on the first semiconductor chip 200, a semiconductor package may be provided to have increased structural stability.

FIG. 6 depicts that the third connection terminals 340 and the sixth connection terminals 380 are in direct contact with the first base layer 201 of the first semiconductor chip 200, but the present disclosure is not limited thereto. As shown in FIG. 7, the first semiconductor chip 200 may have first upper pads 252 and second upper pads 254. The first upper pads 252 and the second upper pads 254 may be provided on the top surface 200c of the first semiconductor chip 200. The first upper pads 252 may be disposed between the second semiconductor chip 500 and the first semiconductor chip 200, and the second upper pads 254 may be disposed between the third semiconductor chip 600 and the first semiconductor chip 200. For example, the first upper pads 252 may have their positions that vertically correspond to those of the first dummy pads 558 of the second semiconductor chip 500, and the second upper pads 254 may have their positions that vertically correspond to those of the second dummy pads 658 of the third semiconductor chip 600. The third connection terminals 340 may connect the first upper pads 252 to the first dummy pads 558. The sixth connection terminals 380 may connect the second upper pads 254 to the second dummy pads 658.

In the embodiment of FIG. 7, the first dummy pads 558 and the third connection terminals 340 may be electrically connected to the second integrated circuit 502 of the second semiconductor chip 500. The second dummy pads 658 and the sixth connection terminals 380 may be electrically connected to the third integrated circuit 602 of the third semiconductor chip 600. The first upper pad 252 and the second upper pad 254 may be connected to each other through a wiring pattern 256 provided on the top surface 200c of the first semiconductor chip 200. Therefore, the second semiconductor chip 500 may be electrically connected to the third semiconductor chip 600 through the first dummy pads 558, the third connection terminals 340, the first upper pads 252, the wiring pattern 256, the second upper pads 254, the sixth connection terminals 380, and the second dummy pads 658.

In some embodiments, neither the first dummy pads 558 nor the third connection terminals 340 may be electrically connected to the second integrated circuit 502 of the second semiconductor chip 500 and neither the second dummy pads 658 nor the sixth connection terminals 380 may be electrically connected to the third integrated circuit 602 of the third semiconductor chip 600. In this case, the wiring pattern 256 may not be provided on the top surface 200c of the first semiconductor chip 200.

Figure 8:
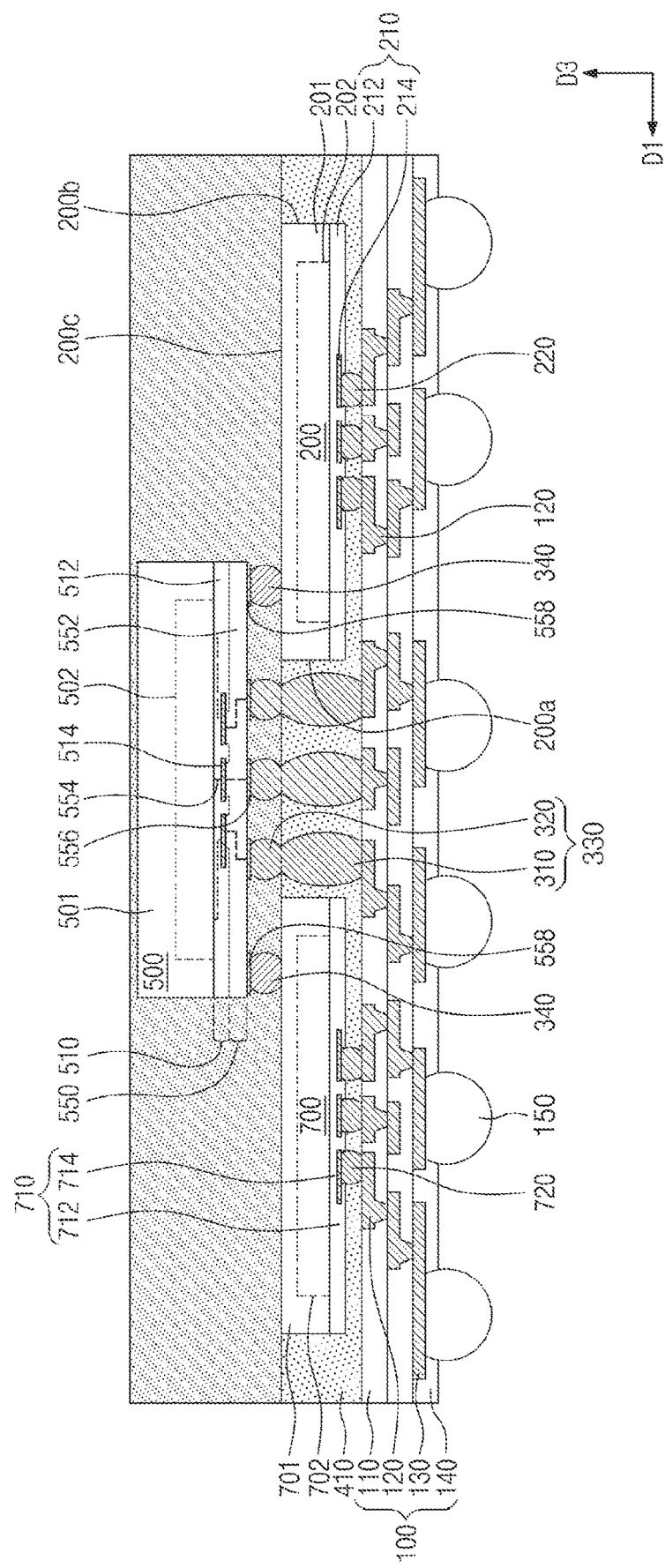

FIG. 8 illustrates a cross-sectional view showing a semiconductor package according to some embodiments of the present disclosure.

Referring to FIG. 8, a fourth semiconductor chip 700 may be disposed on the package substrate 100. The fourth semiconductor chip 700 may be horizontally spaced apart from the first semiconductor chip 200. The fourth semiconductor chip 700 may be disposed on one side in the first direction D1 of the first semiconductor chip 200. In this case, the first vertical connection terminals 330 may be provided between the first semiconductor chip 200 and the fourth semiconductor chip 700.

The fourth semiconductor chip 700 may be configured substantially identical or similar to the first semiconductor chip 200. For example, the fourth semiconductor chip 700 may be of the same type as the first semiconductor chip 200. For example, the fourth semiconductor chip 700 may include a fourth base layer 701 where is formed a fourth integrated circuit 702 of the fourth semiconductor chip 700 and may also include a fourth chip wiring layer 710 disposed on one surface on which the fourth integrated circuit 702 is formed in the fourth base layer 701. The fourth chip wiring layer 710 may include a fourth chip dielectric pattern 712, fourth chip pads 714 connected to the fourth integrated circuit 702 through a wiring pattern in the fourth chip dielectric pattern 712, and a fourth chip passivation layer that exposes the fourth chip pads 714 on the fourth chip dielectric pattern 712. The fourth chip pads 714 may include a metallic material, such as aluminum (Al).

The fourth semiconductor chip 700 may be flip-chip mounted on the package substrate 100. For example, the fourth semiconductor chip 700 may be disposed to allow the fourth chip pads 714 to face the package substrate 100. A plurality of second chip terminals 720 may be provided between the fourth chip pads 714 and the package substrate 100. The second chip terminals 720 may penetrate the fourth passivation layer and may be coupled to the fourth chip pads 714. The fourth semiconductor chip 700 may be connected to the package substrate 100 through the fourth chip pads 714, the second chip terminals 720, and the substrate wiring pattern 120.

The first molding layer 410 may be provided on the package substrate 100. The first molding layer 410 may cover the top surface of the package substrate 100. The first molding layer 410 may surround the first semiconductor chip 200, the fourth semiconductor chip 700, and the first connection terminals 310. The first molding layer 410 may protect the first semiconductor chip 200 and the fourth semiconductor chip 700. For example, the first molding layer 410 may cover lateral surfaces of the first semiconductor chip 200 and lateral surfaces of the fourth semiconductor chip 700. The first molding layer 410 may fill a space between the package substrate 100 and the first semiconductor chip 200 and a space between the package substrate 100 and the fourth semiconductor chip 700. The first molding layer 410 may surround the first chip terminals 220 between the package substrate 100 and the first semiconductor chip 200 and may also surround the second chip terminals 720 between the package substrate 100 and the fourth semiconductor chip 700. The first molding layer 410 may cover lateral surfaces of the first connection terminals 310 and lateral surfaces of the second chip terminals 720. The first molding layer 410 may expose the top surface 200c of the first semiconductor chip 200, a top surface of the fourth semiconductor chip 700, and the top surfaces of the first connection terminals 310. The first molding layer 410 may have a top surface coplanar with the top surface 200c of the first semiconductor chip 200, the top surface of the fourth semiconductor chip 700, and the top surfaces of the first connection terminals 310, and the top surfaces of the molding layer 410, the first semiconductor chip 200, the fourth semiconductor chip 700, and the first connection terminals 310 may be substantially flat.

The second semiconductor chip 500 may be disposed on the first semiconductor chip 200 and the fourth semiconductor chip 700. The second semiconductor chip 500 may be positioned on the rear surface of the first semiconductor chip 200 and a rear surface of the fourth semiconductor chip 700. The second semiconductor chip 500 may have one portion that overlaps the first semiconductor chip 200 and another portion that overlaps the fourth semiconductor chip 700. The second semiconductor chip 500 may have a central portion that is positioned between the one portion and another portion of the second semiconductor chip 500, and the central portion of the second semiconductor chip 500 may be located on the first vertical connection terminals 330.

The second semiconductor chip 500 may be flip-chip mounted on the package substrate 100. For example, the second semiconductor chip 500 may be disposed such that the first signal pads 556 of the first redistribution layer 550 may be directed toward the first molding layer 410. The second semiconductor chip 500 may be connected to the package substrate 100 through the first signal pads 556, the first vertical connection terminals 330, and the substrate wiring pattern 120.

The first dummy pads 558 may be provided between the second semiconductor chip 500 and the rear surface of the first semiconductor chip 200 and between the second semiconductor chip 500 and the rear surface of the fourth semiconductor chip 700. The second semiconductor chip 500 may be supported by the third connection terminals 340 on the rear surfaces of the first and fourth semiconductor chips 200 and 700. Each of the third connection terminals 340 may be in direct contact with either the rear surface of the first semiconductor chip 200 or the rear surface of the fourth semiconductor chip 700.

According to some embodiments of the present disclosure, as the second semiconductor chip 500 is disposed to vertically overlap the first and fourth semiconductor chips 200 and 700, a semiconductor package may be provided with compact size. In addition, as the second semiconductor chip 500 is supported by both the first and fourth semiconductor chips 200 and 700, a semiconductor package may increase in structural stability.

FIGS. 9 to 17 illustrate cross-sectional views showing a method of fabricating a semiconductor package according to some embodiments of the present disclosure.

Figure 9:
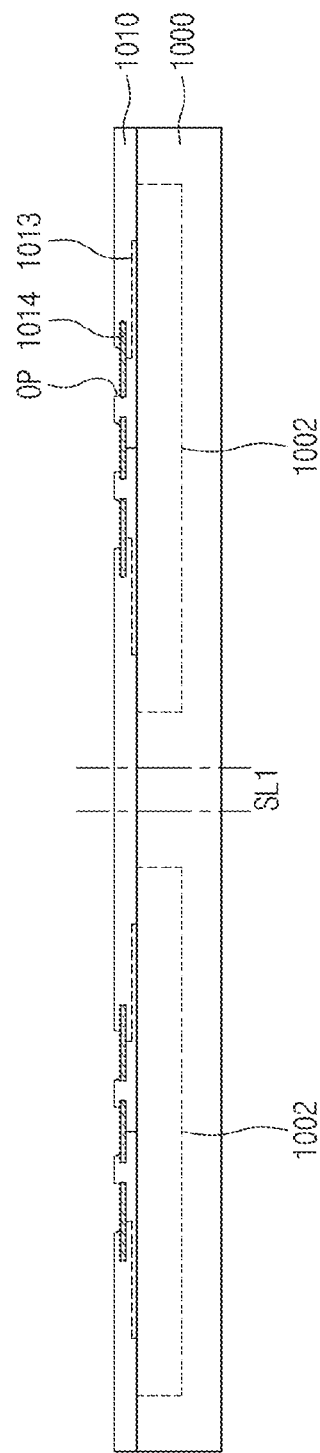
FIGS. 9 to 17 illustrate cross-sectional views showing a method of fabricating a semiconductor package according to some embodiments of the present disclosure.

Referring to FIG. 9, first and second semiconductor chips (see 200 and 500 of FIG. 1) may be formed. FIG. 9 depicts the formation of the first semiconductor chip 200 or the second semiconductor chip 500, and it is assumed that the first and second semiconductor chips 200 and 500 are of the same type as each other. The first semiconductor chip 200 may be same as that discussed with reference to FIGS. 1 to 5. For example, integrated circuits 1002 may be formed on a semiconductor wafer 1000. The semiconductor wafer 1000 may have a top surface as an active surface. A chip wiring layer 1010 may be formed on the top surface of the semiconductor wafer 1000. For example, the formation of the chip wiring layer 1010 may include forming a dielectric pattern on the active surface of the semiconductor wafer 1000, forming a wiring pattern 1013 that penetrates the dielectric pattern and connects with the integrated circuits 1002, forming on the dielectric pattern a plurality of chip pads 1014 that are connected to the wiring pattern 1013, forming on the dielectric pattern a passivation layer that covers the chip pads 1014, and patterning the passivation layer to form openings OP that partially expose top surfaces of the chip pads 1014. The chip pads 1014 may correspond to the first chip pads (see 214 of FIG. 1) of the first semiconductor chip 200 or the second chip pads (see 514 of FIG. 1) of the second semiconductor chip 500.

Afterwards, the semiconductor wafer 1000 may undergo a singulation process performed along a first sawing line SL1 and may thus be separated into the first semiconductor chips 200.

Figure 10:
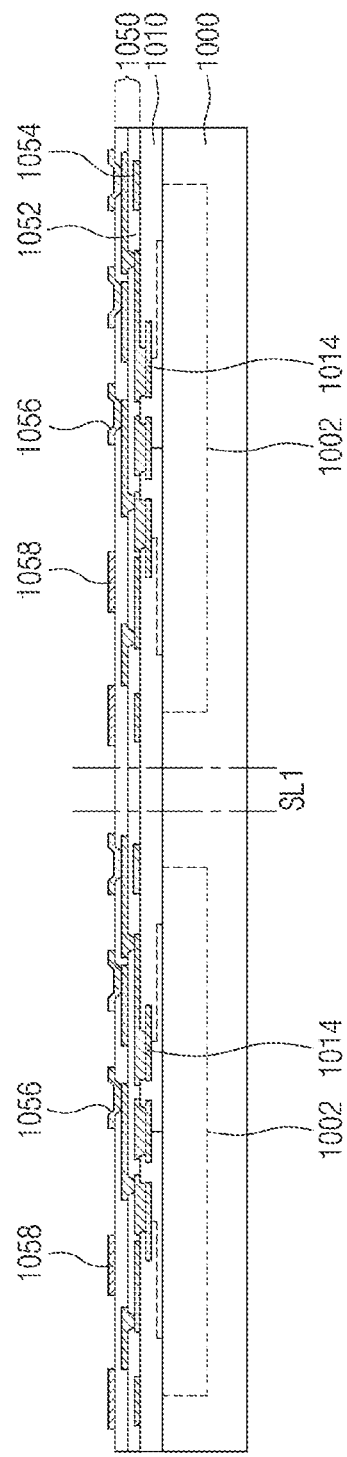

Referring to FIG. 10, a redistribution layer 1050 may be formed before the singulation process is performed on the semiconductor wafer 1000 of FIG. 9. For example, a conductive material may be coated on the top surface of the semiconductor wafer 1000 or a top surface of the chip wiring layer 1010 and the coated conductive material may be patterned to form a wiring pattern 1054. The wiring pattern 1054 may penetrate the openings (see OP of FIG. 9) and may be coupled to the chip pads 1014. The chip wiring layer 1010 may be coated thereon with a dielectric material to form a dielectric pattern 1052 that encapsulates the wiring pattern 1054. Alternatively, the chip wiring layer 1010 may be coated on its top surface with a dielectric material to form the dielectric pattern 1052 and then the wiring pattern 1054 may be formed to penetrate the dielectric pattern 1052 and the passivation layer and may be coupled to the chip pads 1014. The formation of the wiring pattern 1054 and the formation of the dielectric pattern 1052 may be repeatedly performed to form wiring layers that are stacked on each other. After that, signal pads 1056 and dummy pads 1058 may be formed on the dielectric pattern 1052, thereby being coupled to the wiring pattern 1054. For example, the dielectric pattern 1052 may be patterned to form holes that expose the wiring pattern 1054, a metal layer may be formed on the dielectric pattern 1052, and then the metal layer may be patterned to form the signal pads 1056 that are coupled through the holes to the wiring pattern 1054 and to form the dummy pads 1058 that are disposed on a top surface of the dielectric pattern 1052. The signal pads 1056 and the dummy pads 1058 may be components formed in one process. The signal pads 1056 and the dummy pads 1058 may have their top surfaces located at the same level from the top surface of the semiconductor wafer 1000. The redistribution layer 1050 may correspond to the first redistribution layer (see 550 of FIG. 1) of the second semiconductor chip 500. For example, the dielectric pattern 1052 may correspond to the first dielectric pattern (see 552 of FIG. 1) of the first redistribution layer 550, the wiring pattern 1054 may correspond to the first wiring pattern (see 554 of FIG. 1) of the first redistribution layer 550, the signal pads 1056 may correspond to the first signal pads (see 556 of FIG. 1) of the first redistribution layer 550, and the dummy pads 1058 may correspond to the first dummy pads (see 558 of FIG. 1) of the first redistribution layer 550.

Afterwards, the semiconductor wafer 1000 may undergo a singulation process performed along the first sawing line SL1 and may thus be separated into the second semiconductor chips 500.

Figure 11:
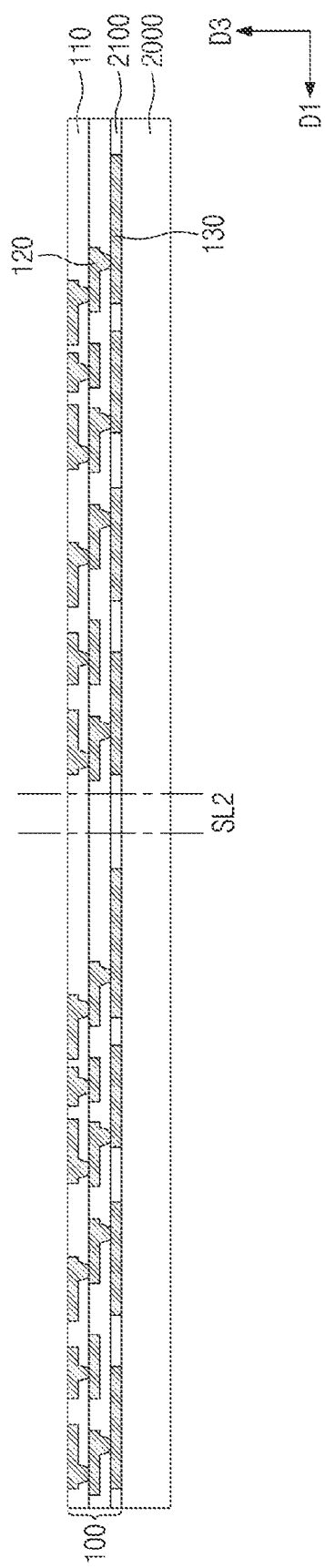

Referring to FIG. 11, a carrier substrate 2000 may be provided. The carrier substrate 2000 may be a dielectric substrate including glass or polymer or may be a conductive substrate including metal. Although not shown, the carrier substrate 2000 may be provided with an adhesive member on a top surface of the carrier substrate 2000. For example, the adhesive member may include a glue tape.

A package substrate 100 may be formed on the carrier substrate 2000. The following will describe in detail the formation of the package substrate 100.

A lower dielectric layer 2100 may be provided on the carrier substrate 2000. The lower dielectric layer 2100 may include a dielectric polymer or a photosensitive polymer.

A plurality of external pads 130 may be formed in the lower dielectric layer 2100. For example, the lower dielectric layer 2100 may be patterned to form openings for forming the external pads 130, a seed layer may be conformally formed in the openings, and then an electroplating process may be performed in which the seed layer is used as a seed to form the external pads 130 that fill the openings.

A substrate dielectric layer 110 may be formed on the lower dielectric layer 2100. The substrate dielectric layer 110 may be formed by a coating process, such as spin coating or slit coating. The substrate dielectric layer 110 may include a photo-imagable dielectric (PID) polymer. For example, the photo-imagable dielectric polymer may include at least one selected from photosensitive polyimide, polybenzoxazole (PBO), phenolic polymers, and benzocyclobutene polymers.

A substrate wiring pattern 120 may be formed. For example, the substrate dielectric layer 110 may be patterned to form openings that expose the external pads 130, a barrier layer and a conductive layer may be formed on the substrate dielectric layer 110 so as to fill the openings, and then the barrier layer and the conductive layer may undergo a planarization process to form the substrate wiring pattern 120. A substrate wiring layer may be formed which includes the substrate dielectric layer 110 and the substrate wiring pattern 120. The formation of the substrate wiring layer may be repeated to form the package substrate 100 in which the substrate wiring layers are stacked. The substrate wiring pattern 120 of an uppermost substrate wiring layer may correspond to a substrate pad of the package substrate 100.

Figure 12:
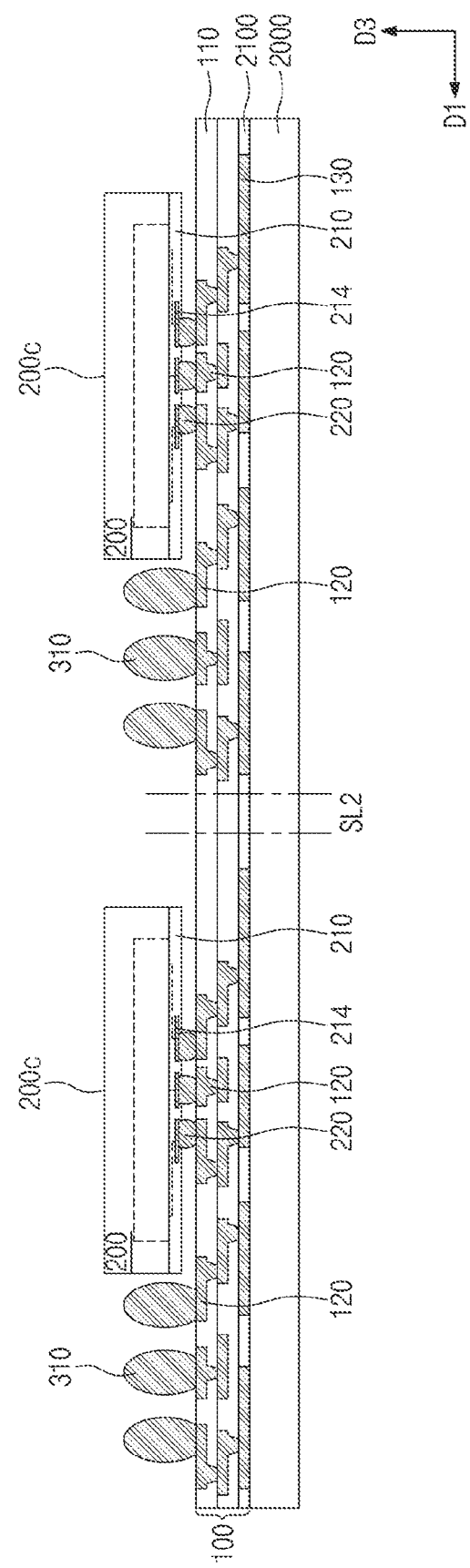

Referring to FIG. 12, the first semiconductor chips 200 may be mounted on the package substrate 100. For example, solder balls may be provided on the first chip pads 214 of the first semiconductor chips 200. The first semiconductor chips 200 may be positioned on the package substrate 100 so as to allow the first chip pads 214 to align with the substrate wiring pattern 120 of the package substrate 100. After that, the first semiconductor chips 200 may descend to allow the solder balls to contact the substrate wiring pattern 120 and then the solder ball may undergo a reflow process to form first chip terminals 220 that connect the first semiconductor chip 200 to the package substrate 100.

A plurality of first connection terminals 310 may be attached to the package substrate 100. On one side in a first direction D1 from each of the first semiconductor chips 200, the first connection terminals 310 may be disposed on the substrate wiring pattern 120 of the package substrate 100. FIG. 12 depicts that top surfaces of the first connection terminals 310 are located at a lower level than that of top surfaces 200c of the first semiconductor chip 200, but the present disclosure is not limited thereto. In some embodiments, the top surfaces of the first connection terminals 310 may be located at a level the same as or higher than that of the top surfaces 200c of the first semiconductor chips 200. The first connection terminals 310 may include a solder ball or a solder bump.

The reflow process may be performed together with the first connection terminals 310. The reflow process may connect the first connection terminals 310 to the substrate wiring pattern 120.

Figure 13:
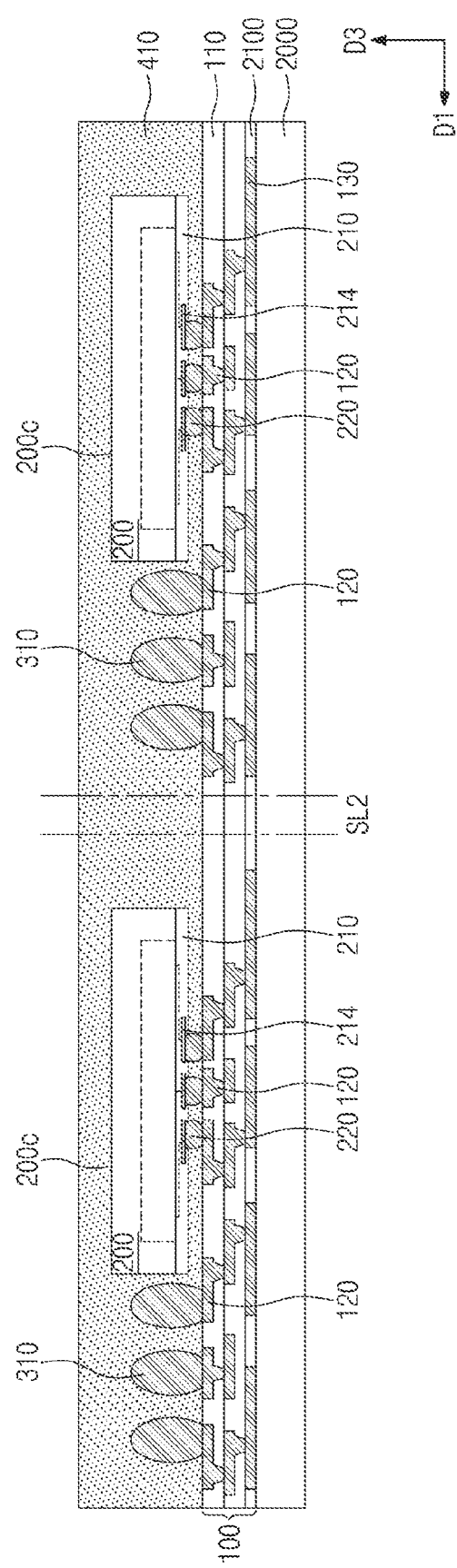

Referring to FIG. 13, a first molding layer 410 may be formed on the package substrate 100. For example, the package substrate 100 may be coated on its top surface with a first molding material to encapsulate the first semiconductor chips 200 and the first connection terminals 310 and the first molding material may be cured to form the first molding layer 410. The first molding layer 410 may cover the top surface of the package substrate 100, lateral surfaces of the first semiconductor chips 200, and rear surfaces of the first semiconductor chips 200. For example, neither the first semiconductor chips 200 nor the first connection terminals 310 may be exposed outside the first molding layer 410. The first molding material may include a dielectric material. The first molding material may include a refractory material. The first molding material may include a dielectric material with excellent cuttability. For example, the first molding material may include polyimide.

Figure 14:
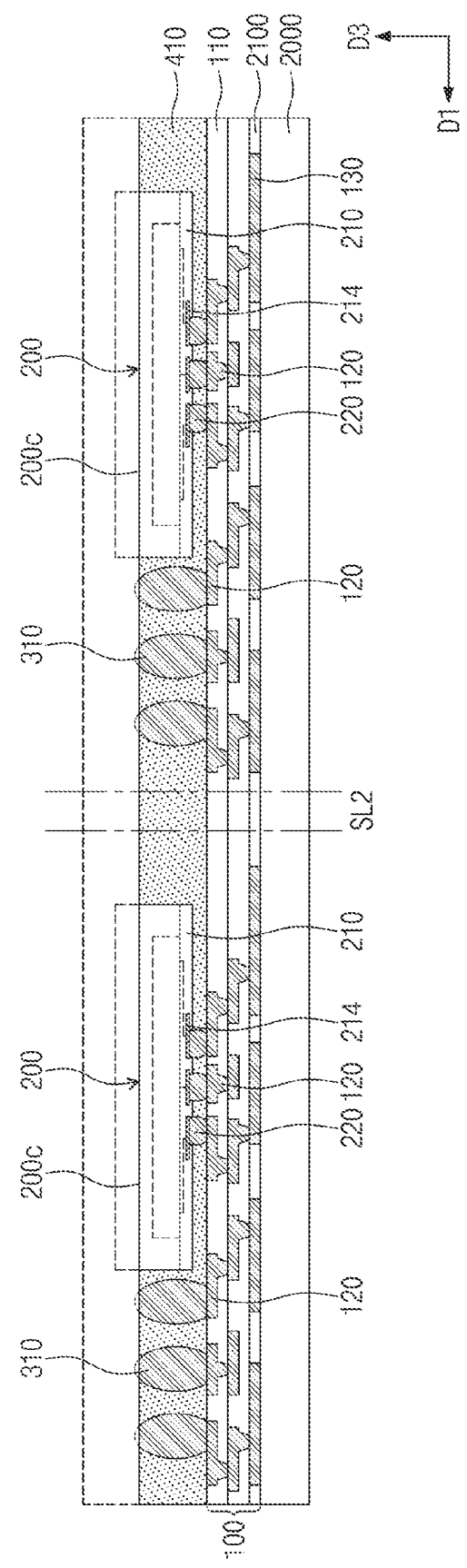

Referring to FIG. 14, a partial removal may be performed on the first molding layer 410, the first semiconductor chip 200, and the first connection terminals 310. For example, the first semiconductor chips 200 may become thinned. In this case, the first molding layer 410 may undergo on its top surface a planarization process such as grinding or chemical mechanical polishing (CMP). Therefore, the first semiconductor chips 200 may become flat on the rear surfaces thereof and the first molding layer 410 may become flat on the top surface thereof. The planarization process may partially remove an upper portion of the first molding layer 410 and upper portions of the first connection terminals 310. For example, the planarization process may expose the rear surfaces of the first semiconductor chips 200 and the upper portions of the first connection terminals 310. The rear surfaces of the first semiconductor chips 200 may be substantially coplanar with the top surfaces of the first connection terminals 310 and the top surface of the first molding layer 410.

According to some embodiments of the present disclosure, as the first semiconductor chips 200 provided in a lower portion of a semiconductor package are formed to have small thicknesses, there may be a reduced distance between the package substrate 100 and the second semiconductor chips 500 provided in an upper portion of the package substrate. Therefore, an electrical distance may be reduced between the second semiconductor chips 500 and the package substrate 100 and the semiconductor package may be provided with improved electrical properties. In addition, the semiconductor package may decrease in height and size.

Because the first molding layer 410 includes the first molding material whose cuttability is excellent, a polishing process may be easily performed on the first molding layer 410. Therefore, it may be possible to provide an easy method of fabricating a semiconductor package.

Figure 15:
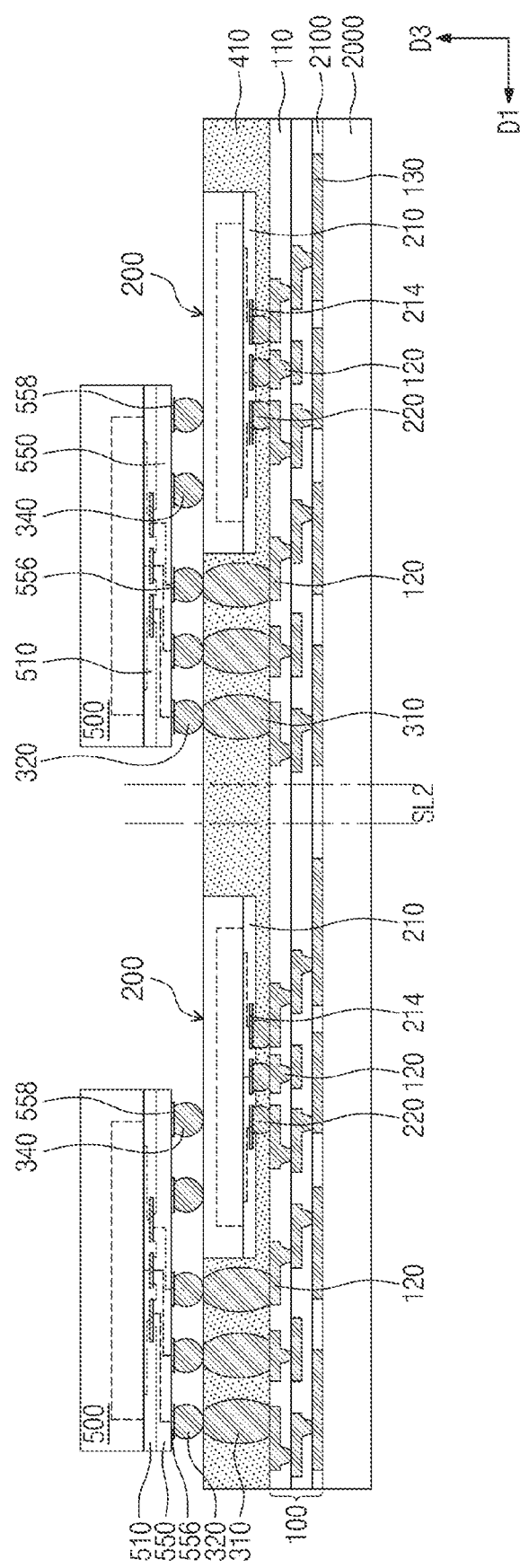

Referring to FIG. 15, the second semiconductor chips 500 may be provided on the first molding layer 410. For example, solder balls 320 and 340 may be provided on the first signal pads 556 and the first dummy pads 558 of the second semiconductor chips 500. The solder balls 320 and 340 may include second connection terminals 320 disposed on the first signal pads 556 and third connection terminals 340 disposed on the first dummy pads 558. The second and third connection terminals 320 and 340 may have the same volume as each other.

The second semiconductor chips 500 may be positioned on the first semiconductor chips 200 and the first connection terminals 310 so as to align the second connection terminals 320 with the first connection terminals 310 and to place the third connection terminals 340 on the top surfaces of the first semiconductor chips 200. Afterwards, the second semiconductor chips 500 may descend to cause the solder balls 320 and 340 to contact the first semiconductor chips 200 and the first connection terminals 310.

The descent of the second semiconductor chips 500 may apply pressure to the first semiconductor chips 200 and the first connection terminals 310. According to some embodiments of the present disclosure, because the first molding layer 410 encapsulates the first semiconductor chips 200 and the first connection terminals 310, the first semiconductor chip 200 and the first connection terminals 310 may be prevented from being damaged or detached from the package substrate 100 due to external pressure. In addition, because the first semiconductor chips 200, the first connection terminals 310, and the first molding layer 410 have their top surfaces that are coplanar with each other, even when the second semiconductor chips 500 are partially misaligned, the second semiconductor chips 500 may not be detached from the first semiconductor chips 200 and the first connection terminals 310. Accordingly, a method of fabricating a semiconductor package may reduce the occurrence of defects.

According to some embodiments, after the solder balls 320 and 340 are provided on the first signal pads 556 and the first dummy pads 558 of the second semiconductor chips 500, a second under-fill part (see 560 of FIG. 5) may be provided on bottom surfaces of the second semiconductor chips 500. The second under-fill part 560 may surround the solder balls 320 and 340. The second under-fill part 560 may include a non-conductive film (NCF). For example, the second under-fill part 560 may be a polymer tape including a dielectric material. Alternatively, the second under-fill part 560 may include a fluidic adhesive member. In this case, it may be possible to fabricate a semiconductor package discussed with reference to FIG. 5.

Figure 16:
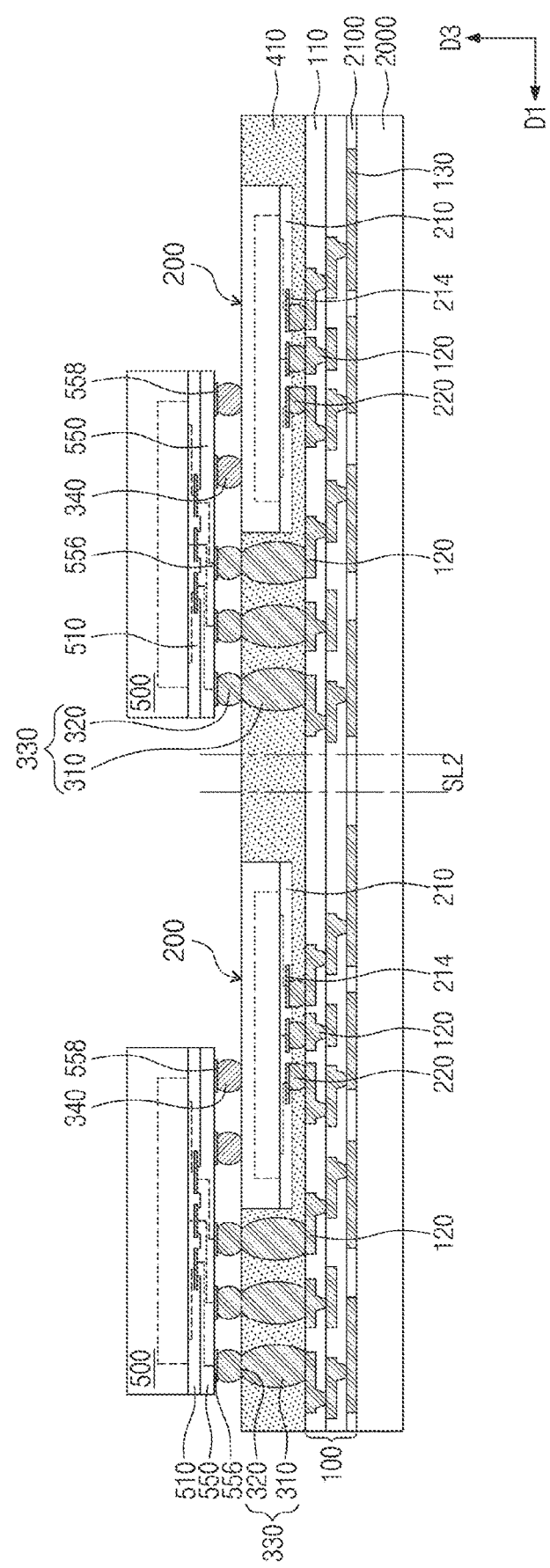

Referring to FIG. 16, the solder balls 320 and 340 may undergo a reflow process to connect the second connection terminals 320 to the first connection terminals 310 and to attach the third connection terminals 340 to the top surface of the first semiconductor chip 200. The first connection terminals 310 and the second connection terminals 320 may be connected to form first vertical connection terminals 330 that connect the package substrate 100 to the second semiconductor chip 500.

For example, the solder balls 320 and 340 may melt in the soldering process and the melted second connection terminals 320 may contact the first connection terminals 310 and the melted third connection terminals 340 may contact the top surfaces of the first semiconductor chips 200. In the reflow process, portions of the first connection terminals 310 may melt and bond to the second connection terminals 320. Alternatively, in the reflow process, the melted second connection terminals 320 may bond to the top surfaces of the first connection terminals 310. When the first and second connection terminals 310 and 320 include the same solder material, invisible interfaces may be provided between the first connection terminals 310 and the second connection terminals 320. In contrast, when the first and second connection terminals 310 and 320 include different solder materials, visible interfaces may be provided between the first connection terminals 310 and the second connection terminals 320.

According to some embodiments of the present disclosure, because the first connection terminals 310 are surrounded by the first molding layer 410, the first connection terminals 310 melted in the reflow process may not be externally discharged or may not be in contact with neighboring other first connection terminals 310. Thus, there may be no occurrence of disconnection where the first connection terminals 310 are not coupled to the second connection terminals 320 or no occurrence of a bridge or short where the first connection terminals 310 are connected to neighboring other first connection terminals 310. Accordingly, it may be possible to provide a semiconductor package fabrication method with a low defect rate.

The second semiconductor chips 500 may be positioned relatively farther away than the first semiconductor chips 200 from the package substrate 100. According to some embodiments of the present disclosure, to connect the package substrate 100 to the second semiconductor chips 500 positioned relatively far away from the package substrate 100, a solder ball may be used which is manufactured in simple fabrication at low cost. Thus, there may be no requirement for a vertical connection structure, such as a post or connection substrate. For example, as the first molding layer 410 is used to fix the first connection terminals 310 at lower positions and the second connection terminals 320 are disposed on the first connection terminals 310, the first and second connection terminals 310 and 320 may be disposed vertically and may be reflowed to form the first vertical connection terminals 330. Accordingly, it may be possible to provide a semiconductor package fabrication method in which fabricating processes are simple and manufacturing cost is small.

Figure 17:
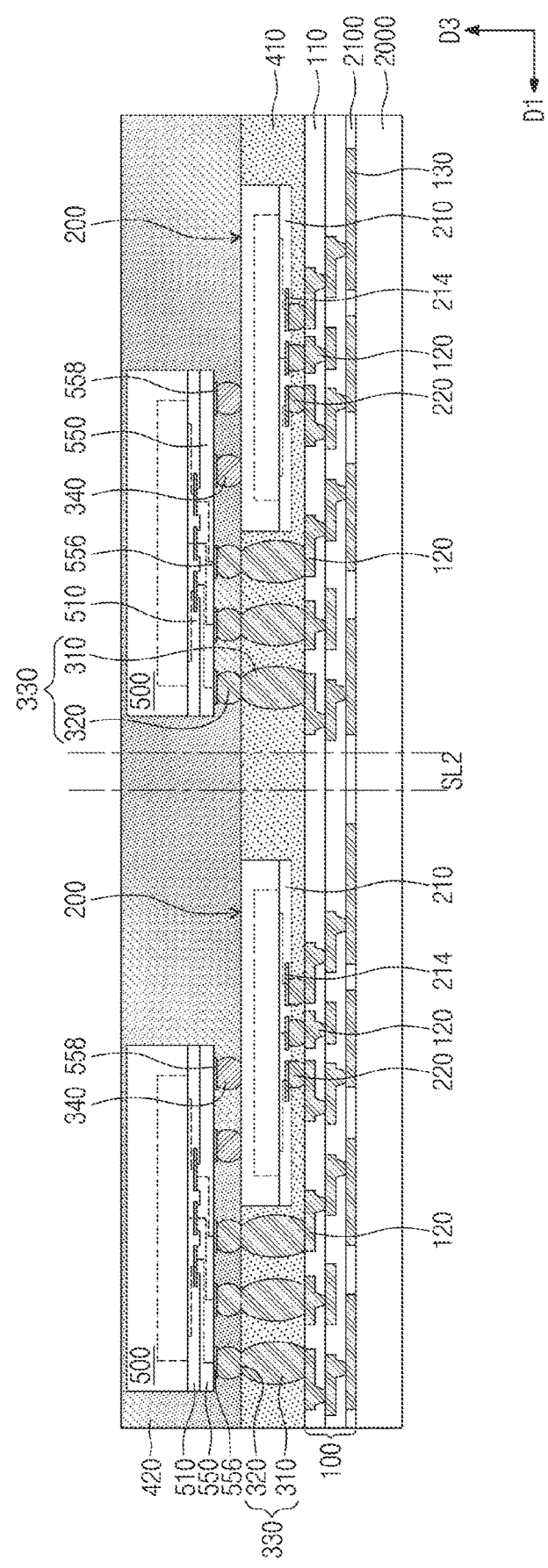

Referring to FIG. 17, a second molding layer 420 may be formed on the first molding layer 410. For example, a second molding material may be coated on the top surface of the first molding layer 410 so as to encapsulate the second semiconductor chips 500 and the second molding material may be cured to form the second molding layer 420. The second molding layer 420 may cover the top surface of the first molding layer 410, lateral surfaces of the second semiconductor chips 500, and rear surfaces of the second semiconductor chip 500. The second molding material may include a dielectric material. The second molding material may include a refractory material. The second molding material may include a dielectric material with poor cuttability and high resistance to abrasion. For example, the second molding material may have rigidity greater than that of the first molding material. The second molding layer 420 with high rigidity may stably protect the second semiconductor chip 500 against external impact. The second molding material may include an epoxy molding compound (EMC).

The second molding layer 420 may have a thermal expansion coefficient different from that of the first molding layer 410. For example, the thermal expansion coefficient of the second molding layer 420 may be similar to that of the package substrate 100. Therefore, a semiconductor package may have the same or similar thermal expansion coefficient at upper and lower portions thereof, and the semiconductor package may be provided with a reduction in warpage due to heat generated from use or fabrication of the semiconductor package.

The carrier substrate 2000 may be removed. The removal of the carrier substrate 2000 may expose a bottom surface of the package substrate 100 or may expose the external pads 130 of the package substrate 100.

Referring back to FIG. 1, the lower dielectric layer 2100 may be removed, and a substrate protection layer 140 may be formed below the package substrate 100. Below the substrate dielectric layer 110, the substrate protection layer 140 may cover the substrate wiring pattern 120 and the external pads 130. Alternatively, a dielectric material layer may be additionally coated on the lower dielectric layer 2100. The lower dielectric layer 2100 and the dielectric material layer may form the substrate protection layer 140.

The substrate protection layer 140 may be patterned to expose the external pads 130. The external pads 130 may be provided thereon with external terminals 150. As such, it may be possible to fabricate a semiconductor package discussed with reference to FIG. 1.

Afterwards, as shown in FIG. 17, the package substrate 100 may undergo a singulation process performed along a second sawing line SL2 and may thus be separated into a plurality of semiconductor packages.

Depending on necessity, the singulation process may be performed prior to the removal of the carrier substrate 2000 and the lower dielectric layer 2100. For example, the carrier substrate 2000 may undergo a singulation process performed along the second sawing line SL2, which may result in separation of the package substrates 100, the first and second semiconductor chips 200 and 500, and the first and second molding layers 410 and 420.

A semiconductor package according to some embodiments of the present disclosure may be configured such that semiconductor chips may be disposed to vertically overlap each other to reduce an area that the semiconductor chips occupy when viewed in a plan view, with the result that the semiconductor package may become small in size. An upper semiconductor chip may be directly connected through vertical connection terminals to a package substrate, and thus there may be a reduced length for electrical connection between the upper semiconductor chip and the package substrate and the semiconductor package may be provided with improved electrical properties. As the vertical connection terminals are formed using solder balls that are easily manufactured at low cost, it may be possible to simplify a fabrication process for the semiconductor package and to cut down the manufacturing cost for the semiconductor package. Moreover, as the upper semiconductor chip is supported through dummy connection terminals on a lower semiconductor chip, the semiconductor package may be provided to have increased structural stability.

According to some embodiments of the present disclosure, connection terminals melted in a reflow process may not be externally discharged or may not be in contact with neighboring other connection terminals. Thus, there may be no occurrence of disconnection between the connection terminals or no occurrence of a bridge or short between the connection terminals. Accordingly, it may be possible to provide a semiconductor package fabrication method with a low defect rate.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

Although the present disclosure has been described in connection with some embodiments of the present disclosure illustrated in the accompanying drawings, it will be understood by one of ordinary skill in the art that variations in form and detail may be made therein without departing from the spirit and essential feature of the present disclosure. The above disclosed embodiments should thus be considered illustrative and not restrictive.

What is claimed is:

1. A semiconductor package comprising:
 a first semiconductor chip mounted on a substrate;
 a buried solder ball on the substrate and spaced apart from the first semiconductor chip;
 a first molding layer on the substrate to encapsulate the first semiconductor chip and the buried solder ball, the first molding layer exposing the first semiconductor chip and the buried solder ball and a top surface of the first molding layer being coplanar with a top surface of the first semiconductor chip;
 a second semiconductor chip on the first molding layer, the second semiconductor chip vertically overlapping the buried solder ball and a portion of the first semiconductor chip; and
 a second molding layer on the first molding layer to cover the second semiconductor chip, wherein:
 the second semiconductor chip is supported on the first semiconductor chip through a dummy solder ball between the first semiconductor chip and the second semiconductor chip, and
 the second semiconductor chip is connected to the buried solder ball through a signal solder ball between the buried solder ball and the second semiconductor chip.

2. The semiconductor package of claim 1, wherein an interface between the first molding layer and the second molding layer is on the same plane of an interface between the buried solder ball and the signal solder ball.

3. The semiconductor package of claim 1, wherein a thermal expansion coefficient of the first molding layer is the same as or greater than a thermal expansion coefficient of the second molding layer.

4. The semiconductor package of claim 1, wherein a first thickness of the first semiconductor chip is less than a second thickness of the second semiconductor chip.

5. The semiconductor package of claim 4, wherein: the first thickness ranges from about 100 μm to about 200 μm, and the second thickness ranges from about 200 μm to about 500 μm.

6. The semiconductor package of claim 1, wherein:
 the first semiconductor chip is mounted through a lower chip solder ball on the substrate, and a width of the signal solder ball and
 a width of the dummy solder ball are greater than a width of the lower chip solder ball and less than a width of the buried solder ball.

7. The semiconductor package of claim 1, wherein:
 the dummy solder ball is in direct contact with the top surface of the first semiconductor chip, and
 the dummy solder ball is electrically insulated from the second semiconductor chip.

8. The semiconductor package of claim 1, wherein:
 the second semiconductor chip has:
 a first region that overlaps the first semiconductor chip; and
 a second region on one side of the first semiconductor chip when viewed in a plan view,
 the dummy solder ball is on the first region, and
 the signal solder ball is on the second region.

9. The semiconductor package of claim 8, further comprising:
 a redistribution layer on a bottom surface of the second semiconductor chip, wherein:
 the redistribution layer includes:
 a dielectric pattern that covers the bottom surface of the second semiconductor chip;
 a wiring pattern in the dielectric pattern and coupled to a chip pad of the second semiconductor chip;

a signal under bump pad on the second region on a bottom surface of the dielectric pattern, the signal under bump pad being connected to the wiring pattern; and a dummy under bump pad on the first region on the bottom surface of the dielectric pattern, the dummy under bump pad being spaced apart from the wiring pattern across the dielectric pattern, the signal solder ball is coupled to the signal under bump pad, and the dummy solder ball is coupled to the dummy under bump pad.

10. The semiconductor package of claim 1, wherein:

a first active surface of the first semiconductor chip faces the substrate, a second active surface of the second semiconductor chip faces the substrate, and the second semiconductor chip and the first semiconductor chip are shifted from each other to expose the second active surface of the second semiconductor chip.

11. A semiconductor package comprising:

a substrate;

a first semiconductor chip and a second semiconductor chip that are sequentially stacked on the substrate, the first and second semiconductor chips being shifted from each other to partially expose an active surface of the second semiconductor chip;

a first molding layer on the substrate and surrounding the first semiconductor chip;

a second molding layer on the first molding layer and surrounding the second semiconductor chip;

a redistribution layer on the active surface of the second semiconductor chip;

a vertical connection structure that penetrates the first and second molding layers and connects the redistribution layer to the substrate;

a first terminal between the substrate and an active surface of the first semiconductor chip, the first terminal electrically connecting the first semiconductor chip to the substrate;

a second terminal between the redistribution layer and an inactive surface of the first semiconductor chip, the second terminal supporting the second semiconductor chip on the first semiconductor chip; and a plurality of external terminals below the substrate, wherein:

the vertical connection structure includes:

a first solder part in the first molding layer; and a second solder part in the second molding layer and connected to an upper portion of the first solder part, the second semiconductor chip is electrically connected to the substrate through the redistribution layer and the vertical connection structure, and a top surface of the first molding layer is coplanar with the inactive surface of the first semiconductor chip.

12. The semiconductor package of claim 11, wherein the second terminal is electrically insulated from the second semiconductor chip.

13. The semiconductor package of claim 11, wherein an interface between the first solder part and the second solder part is coplanar with an interface between the first molding layer and the second molding layer.

14. The semiconductor package of claim 11, wherein a width of the second solder part is less than a width of the first solder part and greater than a width of the first terminal.

15. The semiconductor package of claim 11, wherein a first thickness of the first semiconductor chip is less than a second thickness of the second semiconductor chip.

16. The semiconductor package of claim 15, wherein:

the first thickness ranges from about 100 µm to about 200 µm, and the second thickness ranges from about 200 µm to about 500 µm.

* * * * *